(12) United States Patent
Kim et al.

(10) Patent No.: US 7,443,943 B2
(45) Date of Patent: Oct. 28, 2008

(54) SHIFT REGISTER

(75) Inventors: Binn Kim, Seoul (KR); Tae Woong Moon, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 68 days.

(21) Appl. No.: 11/607,040

(22) Filed: Dec. 1, 2006

(65) Prior Publication Data

US 2008/0002803 A1    Jan. 3, 2008

(30) Foreign Application Priority Data

Jun. 30, 2006    (KR) ...................... 10-2006-0061249

(51) Int. Cl.
*G11C 19/00* (2006.01)
(52) U.S. Cl. ........................ 377/64; 345/100
(58) Field of Classification Search ................... 377/64, 377/69–75, 77–79
See application file for complete search history.

(56) References Cited

U.S. PATENT DOCUMENTS 6,862,013 B2    3/2005    Takeuchi et al. .............. 345/92

2007/0001991 A1*    1/2007    Jang et al. .................... 345/100
2007/0104307 A1*    5/2007    Kim et al. ...................... 377/64

FOREIGN PATENT DOCUMENTS

EP             0 601 649 A1    6/1994
WO       WO 91/11796          8/1991

* cited by examiner

*Primary Examiner*—Tuan T Lam
(74) *Attorney, Agent, or Firm*—Morgan, Lewis & Bockius LLP

(57) ABSTRACT

A shift register includes a first node controller disposed at one side of the non-display region, the first node controller controlling a signal state of a first node, at least one pull-up switching device disposed at the one side of the display region, the pull-up switching device outputting an output pulse according to the signal state of the corresponding first node and supplying it to a corresponding gate line, a second node controller disposed at the other side of the display region, the second node controller controlling a signal state of a second node, and a first pull-down switching device disposed at the other side of the display region, the first pull-down switching device outputting a discharging voltage according to the signal state of the second node and supplying it to the other side of the corresponding gate line.

9 Claims, 13 Drawing Sheets

SHIFT REGISTER

This application claims the benefit of the Korean Patent Application No. P2006-0061249 filed on Jun. 30, 2006, which is hereby incorporated by reference.

BACKGROUND OF THE INVENTION

1. Field of the Invention

The present invention relates to a shift register of a liquid crystal display device, and more particularly, to a shift register having a structure capable of utilizing the non-display region of a liquid crystal panel efficiently.

2. Discussion of the Related Art

In general, a liquid crystal display (LCD) device is adapted to display an image by adjusting light transmittance of a liquid crystal using an electric field. The LCD device includes a liquid crystal panel having pixel areas arranged in matrix form and a driving circuit for driving the liquid crystal panel. The driving circuit includes a gate driver for driving gate lines, a data driver for driving data lines, a timing controller for supplying control signals for control of the gate driver and data driver, and a power supply for supplying various drive voltages to be used in the LCD device.

In particular, the gate driver includes a shift register for sequentially outputting scan pulses, which will hereinafter be described in detail with reference to FIG. 1. FIG. 1 schematically shows the configuration of a conventional shift register. As shown in FIG. 1, a conventional shift register has n stages 101 to 10n connected in cascade. The stages 101 to 10n sequentially output output pulses Vout1 to Voutn in response to a clock pulse CLK supplied thereto. These output pulses Vout1 to Voutn are sequentially supplied to the gate lines of the liquid crystal panel to drive the gate lines accordingly.

To increase the screen area of the LCD device, the number and length of the gate lines should also be increased. Furthermore, in order to drive the gate lines at high speed, the area of each switching device in each stage should be increased. Overall, the size of the shift register should be increased to obtain an LCD device with a large screen area operating at a high speed.

The liquid crystal panel has a display region, and a non-display region surrounding the display region. The stages of the shift register are formed in a portion of the non-display region located at one side of the display region of the liquid crystal panel. However, the increase in the switching device area, as mentioned above, makes it difficult to integrate a large number of switching devices in the limited space of the non-display region.

SUMMARY OF THE INVENTION

Accordingly, the present invention is directed to a shift register that substantially obviates one or more problems due to limitations and disadvantages of the related art.

An object of the present invention is to provide a shift register wherein switching devices in each stage are functionally divided and separately disposed in a portion of a non-display region located at one side of a display region of a liquid crystal panel and in a portion of the non-display region located at the other side of the display region, so that the entire area of the non-display region can be efficiently utilized.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the shift register includes a first node controller disposed at one side of the non-display region, the first node controller controlling a signal state of a first node, at least one pull-up switching device disposed at the one side of the display region, the pull-up switching device outputting an output pulse according to the signal state of the corresponding first node and supplying it to a corresponding gate line, a second node controller disposed at the other side of the display region, the second node controller controlling a signal state of a second node, and a first pull-down switching device disposed at the other side of the display region, the first pull-down switching device outputting a discharging voltage according to the signal state of the second node and supplying it to the other side of the corresponding gate line.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
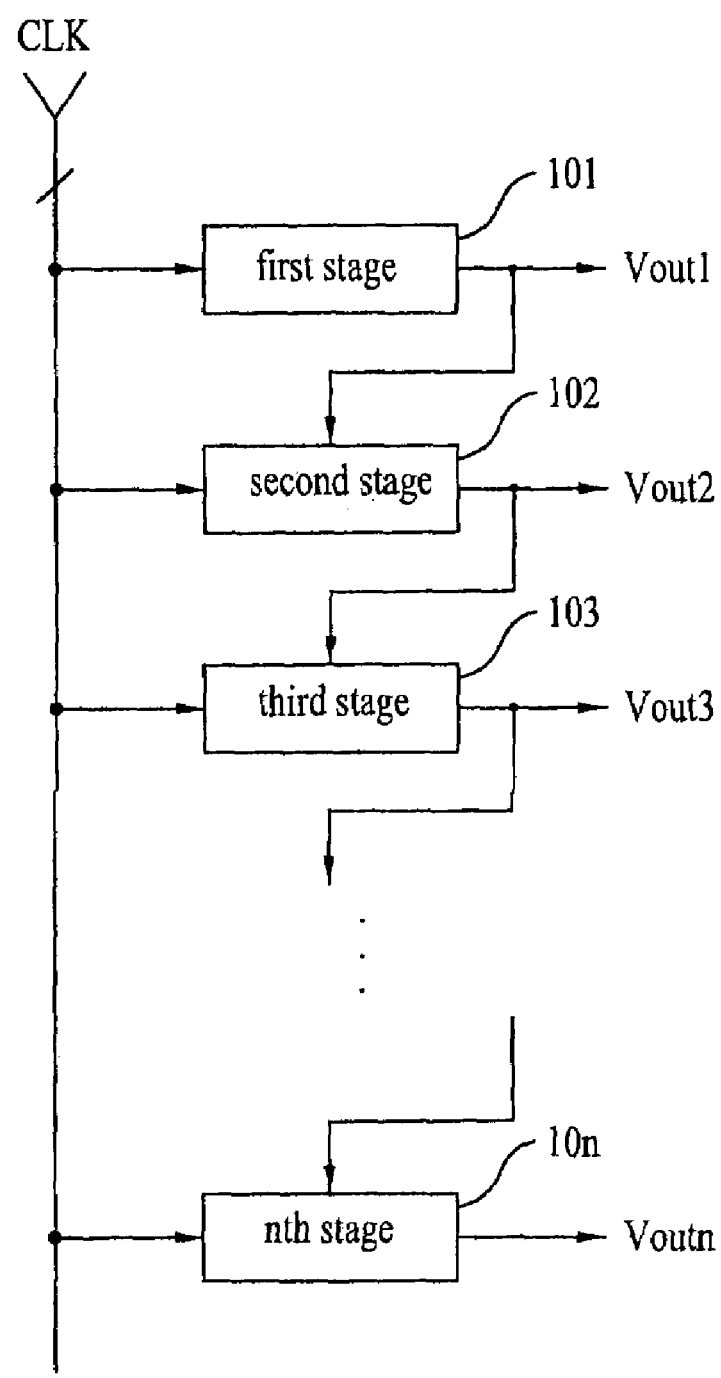
FIG. 1 is a schematic view of a conventional shift register according to the related art.
Figure 2:
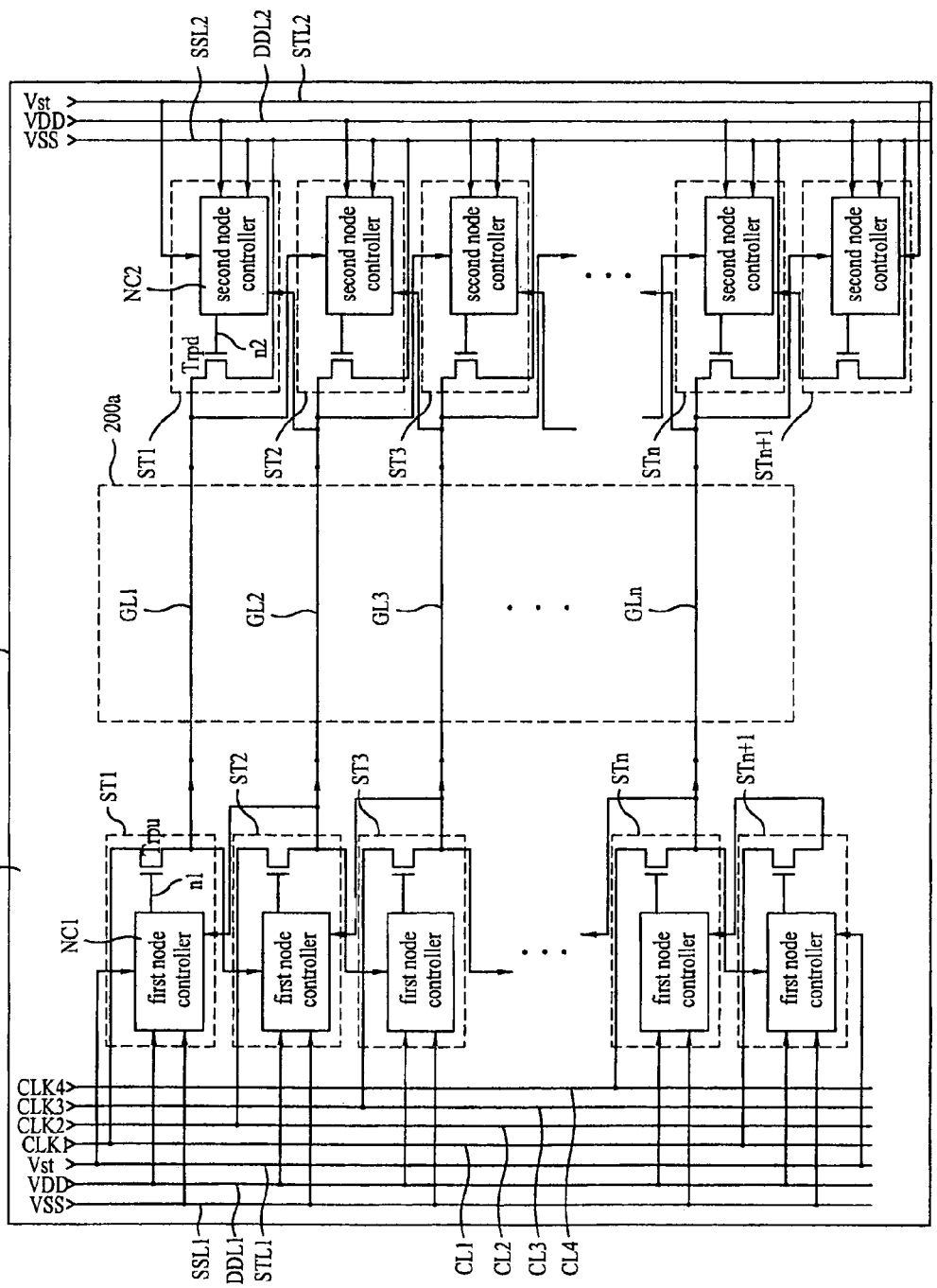
FIG. 2 is a schematic view of a shift register according to a first exemplary embodiment of the present invention.
Figure 3:
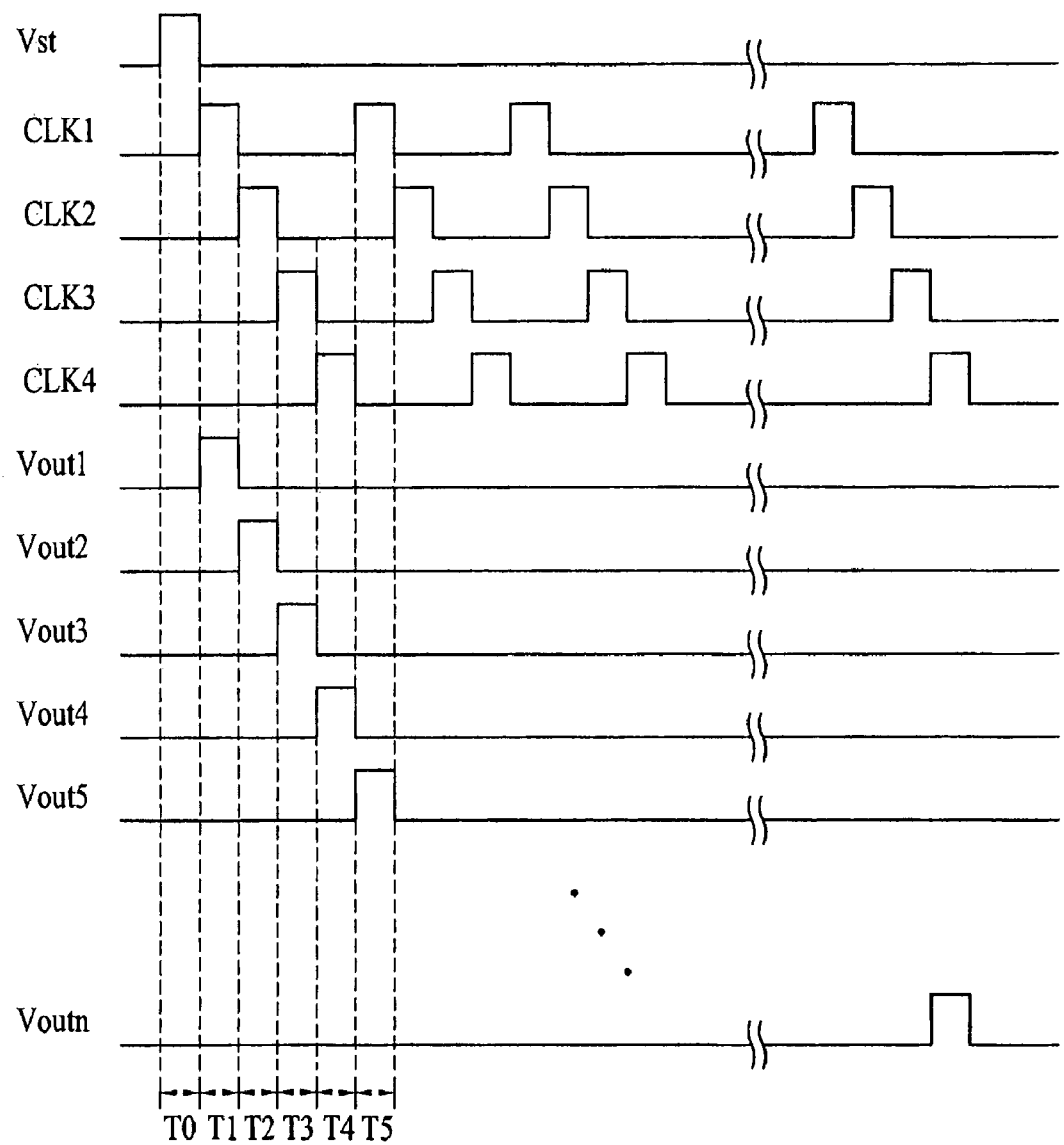
FIG. 3 is a timing diagram of various signals supplied to the shift register of FIG. 2 and output pulses outputted therefrom.

FIG. 2 schematically shows an exemplary configuration of a shift register according to a first embodiment of the present invention. FIG. 3 is a timing diagram of various input signals supplied to the shift register in FIG. 2 and output pulses outputted therefrom. As shown in FIG. 2, the shift register according to the first exemplary embodiment of the present invention comprises n stages ST1 to STn connected in cascade and a dummy stage STn+1. The stages ST1 to STn and the dummy stage STn+1 are mounted in a non-display region 200b of a liquid crystal panel 200. All the stages output output pulses Vout1 to Voutn+1 sequentially during a single period of a frame (FIG. 3). In particular, the output pulses Vout1 to Voutn+1 are outputted in the following order: from the first stage ST1 to the dummy stage STn+1. The output pulses Vout1 to Voutn outputted from the stages ST1 to STn are sequentially supplied to gate lines GL1 to GLn of a display region 200a to sequentially scan the gate lines GL1 to GLn. Notice that the dummy stage STn+1 is not supplied to any gate line.

In each stage, i.e., ST1 to STn+1, there are a first node n1, a second node n2, a first node controller NC1, a second node controller NC2, a pull-up switching device Trpu, and a pull-down switching device Trpd. The first node n1, first node controller NC1 and pull-up switching device Trpu of each of the stages ST1 to STn+1 are formed at the left side of the display region 200a. The second node n2, second node controller NC2 and pull-down switching device Trpd of each of the stages ST1 to STn+1 are formed at the right side of the display region 200a.

The first node controller NC1 controls the signal state of the first node n1. In particular, the first node controller NC1 charges or discharges the first node n1. The second node controller NC2 controls the signal state of the second node n2. In particular, the second node controller NC2 charges or discharges the second node n2. The first and second node controllers NC1 and NC2 cooperate to keep the second node n2 discharged when the first node n1 is in its charged state, and charged when the first node n1 is in its discharged state.

The pull-up switching device Trpu of the kth stage (k is a natural number) is turned on or off according to the signal state of the first node n1 of the kth stage, and outputs a clock pulse supplied from a clock transfer line. This output pulse is then supplied to the first and second node controllers NC1 and NC2 of the (k−1)th stage, the first and second node controllers NC1 and NC2 of the (k+1)th stage, and one side of the kth gate line. The pull-down switching device Trpd of the kth stage is turned on or off according to the signal state of the second node n2 of the kth stage, and supplies a discharging voltage VSS to the other side of the kth gate line when being turned on.

The first node controller NC1 of the kth stage charges the first node n1 of the kth stage with a charging voltage VDD (or clock pulse) in response to the output pulse from the pull-up switching device Trpu of the (k−1)th stage. The second node controller NC2 of the kth stage discharges the second node n2 of the kth stage with the discharging voltage VSS in response to the output pulse from the pull-up switching device Trpu of the (k−1)th stage. At this time, the second node controller NC2 of the kth stage receives the output pulse from the pull-up switching device Trpu of the (k−1)th stage through the (k−1)th gate line. In other words, the (k−1)th output pulse outputted from the pull-up switching device Trpu of the (k−1)th stage is supplied to the second node controller NC2 of the kth stage via the (k−1)th gate line. On the other hand, because there is no stage in the front of the first stage ST1, the first node controller NC1 of the first stage ST1 charges the first node n1 of the first stage ST1 with the charging voltage VDD in response to a start pulse Vst supplied from a start transfer line. The second node controller NC2 of the first stage ST1 discharges the second node n2 of the first stage ST1 with the discharging voltage VSS in response to the start pulse Vst from the start transfer line. The first node controller NC1 of the kth stage discharges the first node n1 of the kth stage with the discharging voltage VSS in response to the output pulse from the pull-up switching device Trpu of the (k+1)th stage.

The second node controller NC2 of the kth stage charges the second node n2 of the kth stage with the charging voltage VDD in response to the output pulse from the pull-up switching device Trpu of the (k+1)th stage. At this time, the second node controller NC2 of the kth stage receives the output pulse from the pull-up switching device Trpu of the (k+1)th stage through the (k+1)th gate line. In other words, the (k+1)th output pulse outputted from the pull-up switching device Trpu of the (k+1)th stage is supplied to the second node controller NC2 of the kth stage via the (k+1)th gate line. On the other hand, because there is no stage after the dummy stage STn+1, the first node controller NC1 of the dummy stage STn+1 discharges the first node n1 of the dummy stage STn+1 with the discharging voltage VSS in response to the start pulse Vst supplied from the start transfer line. Also, the second node controller NC2 of the dummy stage STn+1 charges the second node n2 of the dummy stage STn+1 with the charging voltage VDD in response to the start pulse Vst from the start transfer line. In a portion of the non-display region 200b located at the left side of the display region 200a, first to fourth clock transfer lines CL1 to CL4 which transfer first to fourth clock pulses CLK1 to CLK4, respectively, are formed. Furthermore, a first start transfer line STL1 which transfers the start pulse Vst, a first charging voltage line DDL1 which transfers the charging voltage VDD, and a first discharging voltage line SSL1 which transfers the discharging voltage VSS are formed at the left side of the display region 200a. On the other hand, in a portion of the non-display region 200b located at the right side of the display region 200a, a second start transfer line STL2 which transfers the start pulse Vst, a second charging voltage line DDL2 which transfers the charging voltage VDD, and a second discharging voltage line SSL2 which transfers the discharging voltage VSS, are formed.

The first to fourth clock pulses CLK1 to CLK4 are outputted out of phase with one another. In particular, the second clock pulse CLK2 is outputted after being phase-delayed by one pulse width from the first clock pulse CLK1, and the third clock pulse CLK3 is outputted after being phase-delayed by one pulse width from the second clock pulse CLK2. The fourth clock pulse CLK4 is outputted after being phase-delayed by one pulse width from the third clock pulse CLK3, and the first clock pulse CLK1 is outputted after being phase-delayed by one pulse width from the fourth clock pulse CLK4. The first to fourth clock pulses CLK1 to CLK4 are outputted sequentially and cyclically. In other words, the first to fourth clock pulses CLK1 to CLK4 are outputted sequentially from the first clock pulse CLK1 to the fourth clock pulse CLK4 and, thereafter, again from the first clock pulse CLK1 to the fourth clock pulse CLK4. As a result, the first clock pulse CLK1 is outputted in a period between the fourth clock pulse CLK4 and the second clock pulse CLK2. The fourth clock pulse CLK4 and the start pulse Vst may be outputted in synchronization with each other. In this case where the start pulse Vst is synchronized with the fourth clock pulse CLK4, the fourth clock pulse CLK4 is outputted earliest among the four clock pulses CLK1 to CLK4.

As shown in FIG. 3, it should be noted that the start pulse Vst is outputted only once for a period of one frame, whereas each of the clock pulses CLK1 to CLK4 is outputted several times for the period of one frame. In other words, the start pulse Vst exhibits its active state (high state) only once for the period of one frame, whereas each of the clock pulses CLK1 to CLK4 exhibits its active state periodically several times for the period of one frame. As an aside, the shift register according to the present invention does not necessarily have to employ four clock pulses with different phases. Instead, it may employ two clock pulses with different phases (two-phase clock pulse) or three clock pulses with different phases (three-phase clock pulse). Alternatively, the shift register according to the present invention may employ five clock pulses or more with different phases. An embodiment where four-phase clock pulses are supplied to the shift register is the first exemplary embodiment of the present invention.

In this exemplary embodiment, a clock pulse as follows is supplied to the drain terminal of the pull-up switching device Trpu in each of the stages ST1 to STn+1. In other words, the pull-up switching devices Trpu of the (4g+1)th stages (g is a natural number, including 0) are supplied with the first clock pulse CLK1, and the pull-up switching devices Trpu of the (4g+2)th stages are supplied with the second clock pulse CLK2. The pull-up switching devices Trpu of the (4g+3)th stages are supplied with the third clock pulse CLK3, and the pull-up switching devices Trpu of the (4g+4)th stages are supplied with the fourth clock pulse CLK4. For example, the pull-up switching device Trpu of the second stage ST2 in FIG. 2 is supplied with the second clock pulse CLK2. The charging voltage VDD and the discharging voltage VSS have different levels, and the charging voltage VDD has a level higher than that of the discharging voltage VSS. In general, the charging voltage VDD exhibits a positive polarity, and the discharging voltage VSS exhibits a negative polarity. However, the discharging voltage VSS may be a ground voltage in this exemplary embodiment.

The operation of the shift register with the above-stated configuration according to the first exemplary embodiment of the present invention will hereinafter be described. First, a description will be given of an operation in an initial period T0. In the initial period T0, only the start pulse Vst is maintained at a high state and the clock pulses CLK1 to CLK4 are maintained at a low state. The first stage ST1 is operated in response to the start pulse Vst of the high state. In other words, in response to the start pulse Vst, the first node controller NC1 of the first stage ST1 charges the first node n1 of the first stage ST1 with the charging voltage VDD (or clock pulse). Also, in response to the start pulse Vst, the second node controller NC2 of the first stage ST1 discharges the second node n2 of the first stage ST1 with the discharging voltage VSS. Then, the pull-up switching device Trpu of the first stage ST1, the gate terminal of which is connected to the charged first node n1, is turned on. The pull-down switching device Trpd of the first stage ST1, the gate terminal of which is connected to the discharged second node n2, is turned off. The start pulse Vst is also supplied to the first and second node controllers NC1 and NC2 of the dummy stage STn+1. At this time, the first node controller NC1 of the dummy stage STn+1 turns off the pull-up switching device Trpu of the dummy stage STn+1, and the second node controller NC2 of the dummy stage STn+1 turns on the pull-down switching device Trpd of the dummy stage STn+1.

Next, a description will be given of an operation in a first period T1. In the first period T1, only the first clock pulse CLK1 is maintained at the high state, and the remaining clock pulses CLK2 to CLK4, including the start pulse Vst, are maintained at the low state. The first clock pulse CLK1 is supplied to the pull-up switching devices Trpu of the (4g+1)th stages. At this time, since only the first stage ST1 is a stage whose first node n1 is charged (i.e., an enabled stage), only the pull-up switching device Trpu of the first stage ST1 is turned on among the (4g+1)th stages. The pull-up switching devices Trpu of the remaining stages are turned off. Accordingly, in the first period T1, only the pull-up switching device Trpu of the first stage ST1 outputs the first clock pulse CLK1. This first clock pulse CLK1 outputted from the pull-up switching device Trpu of the first stage ST1 is the first output pulse Vout1. The first output pulse Vout1 functions not only as a first scan pulse to drive the first gate line GL1, but also as a start pulse to enable the next stage, or second stage ST2. In other words, the first output pulse Vout1 outputted in the first period T1 is supplied to the first node controller NC1 and second node controller NC2 of the second stage ST2. As a result, the first node n1 of the second stage ST2 is charged and the second node n2 thereof is discharged. Here, the first output pulse Vout1 is supplied to the second node controller NC2 of the second stage ST2 through the first gate line GL1.

Next, a description will be given of an operation in a second period T2. In the second period T2, only the second clock pulse CLK2 is maintained at the high state, and the remaining clock pulses CLK1, CLK3 and CLK4, including the start pulse Vst, and the first output pulse Vout1 are maintained at the low state. The second clock pulse CLK2 is supplied to the pull-up switching devices Trpu of the (4g+2)th stages. At this time, because only the second stage ST2 is a stage whose first node n1 is charged (i.e., an enabled stage), only the pull-up switching device Trpu of the second stage ST2 is turned on among the (4g+2) the stages. The pull-up switching devices Trpu of the remaining stages are turned off. Hence, in the second period T2, only the pull-up switching device Trpu of the second stage ST2 outputs the second clock pulse CLK2. This second clock pulse CLK2 outputted from the pull-up switching device Trpu of the second stage ST2 is the second output pulse Vout2. The second output pulse Vout2 functions not only as a second scan pulse to drive the second gate line GL2, but also as a start pulse to enable the next stage, or third stage ST3. In other words, the second output pulse Vout2 outputted in the second period T2 is supplied to the first node controller NC1 and second node controller NC2 of the third stage ST3. As a result, the first node n1 of the third stage ST3 is charged and the second node n2 thereof is discharged. Here, the second output pulse Vout2 is supplied to the second node controller NC2 of the third stage ST3 through the second gate line GL2. The second output pulse Vout2 outputted from the second stage ST2 is also supplied to the previous stage, or first stage ST1. In other words, the second output pulse Vout2 outputted from the second stage ST2 is supplied to the first and second node controllers NC1 and NC2 of the first stage ST1. Here, the second output pulse Vout2 is supplied to the second node controller NC2 through the second gate line GL2.

The first node controller NC1 of the first stage ST1 discharges the first node n1 of the first stage ST1 with the discharging voltage VSS in response to the second output pulse Vout2 supplied thereto. The second node controller NC2 of the first stage ST1 charges the second node n2 of the first stage ST1 with the charging voltage VDD in response to the second output pulse Vout2 supplied thereto. Then, the pull-up switching device Trpu of the first stage ST1, connected to the discharged first node n1 through the gate terminal thereof, is turned off. The pull-down switching device Trpd of the first stage ST1, connected to the charged second node n2 through the gate terminal thereof, is turned on. Consequently, the discharging voltage VSS is supplied to the first gate line GL1 through the turned-on pull-down switching device Trpd, thereby causing the first gate line GL1 to be discharged. In this manner, each of the stages ST1 to STn is enabled in response to the output pulse from the previous stage, so as to output the clock pulse supplied thereto after being enabled. Each of the stages ST1 to STn is also disabled in response to the output pulse from the next stage and discharges the corresponding gate line.

Figure 4:
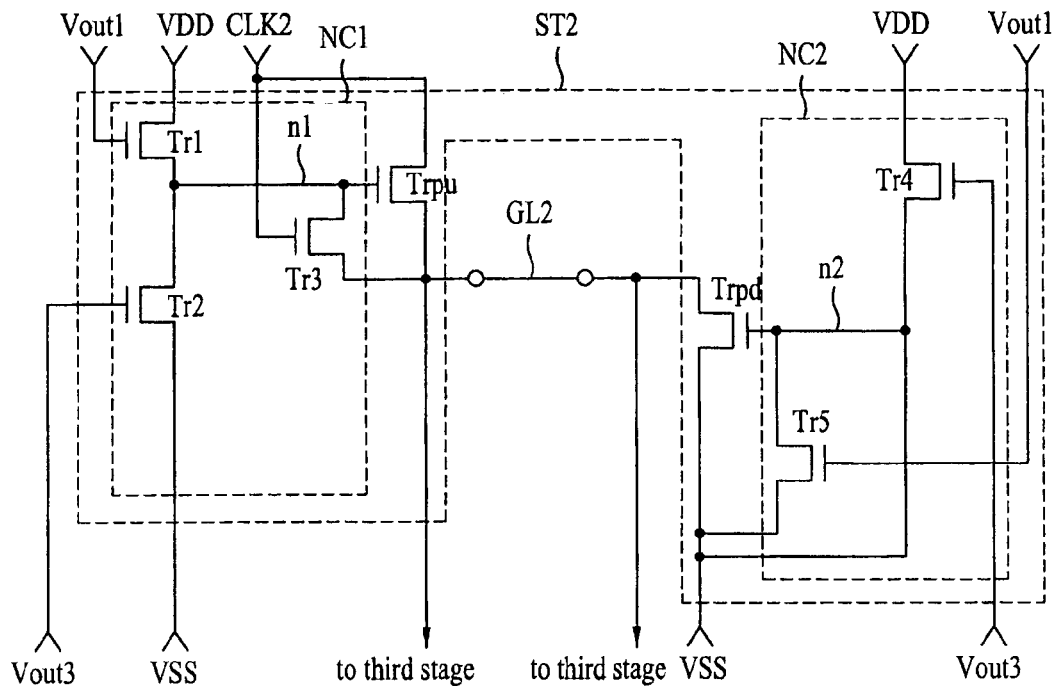
FIG. 4 is a circuit diagram showing the circuit configuration of one exemplary embodiment of a second stage in FIG. 2.

Now, circuit diagrams, including the stages ST1 to STn+1, that perform the operation described above will be described. FIG. 4 is a circuit diagram showing the circuit configuration of one exemplary embodiment of the second stage ST2 in FIG. 2. The first node controller NC1 of each of the stages ST1 to STn+1 includes first to third switching devices Tr1 to Tr3. The first switching device Tr1 of the first node controller NC1 of the kth stage acts to supply the charging voltage VDD to the first node n1 of the kth stage in response to the (k−1)th output pulse outputted from the pull-up switching device Trpu of the (k−1)th stage.

The first switching device Tr1 of the kth stage has a gate terminal connected to the source terminal of the pull-up switching device Trpu of the (k−1)th stage, a drain terminal connected to the first charging voltage line DDL1, and a source terminal connected to the first node n1 of the kth stage. For example, the first switching device Tr1 of the second stage ST2 of FIG. 4 charges the first node n1 of the second stage ST2 with the charging voltage VDD in response to the first output pulse Vout1 from the first stage ST1.

The second switching device Tr2 of the first node controller NC1 of the kth stage acts to supply the discharging voltage VSS to the first node n1 of the kth stage in response to the (k+1)th output pulse outputted from the pull-up switching device Trpu of the (k+1)th stage. The second switching device Tr2 of the kth stage has a gate terminal connected to the source terminal of the pull-up switching device Trpu of the (k+1)th stage, a drain terminal connected to the first node n1 of the kth stage, and a source terminal connected to the first discharging voltage line SSL1. For example, the second switching device Tr2 of the second stage ST2 of FIG. 4 discharges the first node n1 of the second stage ST2 with the discharging voltage VSS in response to the third output pulse Vout3 from the third stage ST3.

The third switching device Tr3 of the first node controller NC1 of the kth stage acts to electrically connect the first node n1 with the source terminal of the pull-up switching device Trpu in response to the clock pulse from the clock transfer line. The third switching device Tr3 of the kth stage has a gate terminal connected to the clock transfer line, a drain terminal connected to the first node n1 of the kth stage, and a source terminal connected to the source terminal of the pull-up switching device Trpu of the kth stage. Here, the clock pulse supplied to the gate terminal of the third switching device Tr3 is in phase with that supplied to the drain terminal of the pull-up switching device Trpu. For example, the third switching device Tr3 of the second stage ST2 of FIG. 4 electrically connects the first node n1 of the second stage ST2 with the source terminal of the pull-up switching device Trpu of the second stage ST2 in response to the second clock pulse CLK2. The second node controller NC2 of each of the stages ST1 to STn+1 includes fourth and fifth switching devices Tr4 and Tr5. The fourth switching device Tr4 of the second node controller NC2 of the kth stage acts to supply the charging voltage VDD to the second node n2 of the kth stage in response to the (k+1)th output pulse outputted from the pull-up switching device Trpu of the (k+1)th stage.

The fourth switching device Tr4 of the kth stage has a gate terminal connected to the source terminal of the pull-up switching device Trpu of the (k+1)th stage through the (k+1)th gate line, a drain terminal connected to the second charging voltage line DDL2, and a source terminal connected to the second node n2 of the kth stage. For example, the fourth switching device Tr4 of the second stage ST2 of FIG. 4 charges the second node n2 of the second stage ST2 with the charging voltage VDD in response to the third output pulse Vout3 from the third stage ST3.

The fifth switching device Tr5 of the second node controller NC2 of the kth stage acts to supply the discharging voltage VSS to the second node n2 of the kth stage in response to the (k−1)th output pulse outputted from the pull-up switching device Trpu of the (k−1)th stage. The fifth switching device Tr5 of the kth stage has a gate terminal connected to the source terminal of the pull-up switching device Trpu of the (k−1)th stage through the (k−1)th gate line, a drain terminal connected to the second node n2 of the kth stage, and a source terminal connected to the second discharging voltage line SSL2. For example, the fifth switching device Tr5 of the second stage ST2 of FIG. 4 discharges the second node n2 of the second stage ST2 with the discharging voltage VSS in response to the first output pulse Vout1 from the first stage ST1. Meanwhile, the first switching device Tr1 of the first node controller NC1 of the first stage ST1 charges the first node n1 of the first stage ST1 with the charging voltage VDD in response to the start pulse Vst from the first start transfer line STL1. The fifth switching device Tr5 of the second node controller NC2 of the first stage ST1 discharges the second node n2 of the first stage ST1 with the discharging voltage VSS in response to the start pulse Vst from the second start transfer line STL2. The second switching device Tr2 of the first node controller NC1 of the nth stage STn discharges the first node n1 of the nth stage STn with the discharging voltage VSS in response to the start pulse Vst from the first start transfer line STL1.

Figure 5:
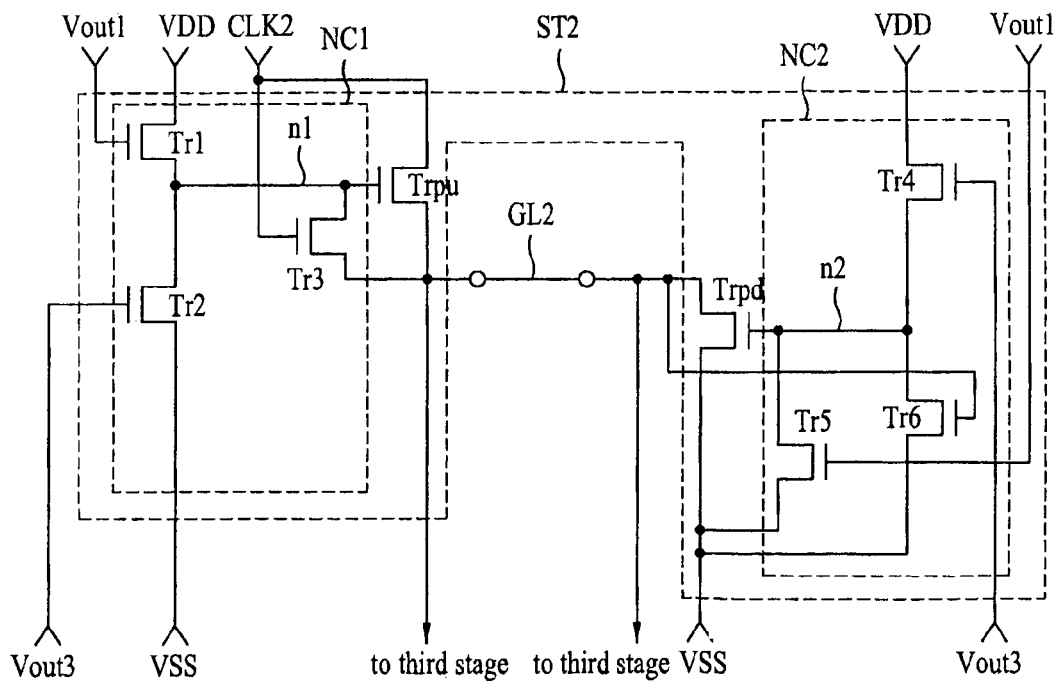
FIG. 5 is a circuit diagram showing the circuit configuration of another exemplary embodiment of the second stage in FIG. 2.

FIG. 5 is a circuit diagram showing the circuit configuration of another exemplary embodiment of the second stage ST2 in FIG. 2. In the circuit configuration of FIG. 5, the second node controller NC2 of each of the stages ST1 to STn+1 further includes a sixth switching device Tr6. The sixth switching device Tr6 of the second node controller NC2 of the kth stage acts to supply the discharging voltage VSS to the second node n2 of the kth stage in response to the output pulse outputted from the pull-up switching device Trpu of the (k)th stage. The sixth switching device Tr6 of the kth stage has a gate terminal connected to the source terminal of the pull-up switching device Trpu of the (k)th stage through the (k)th gate line, a drain terminal connected to the second node n2 of the kth stage, and a source terminal connected to the second discharging voltage line SSL2. For example, the sixth switching device Tr6 of the second stage ST2 of FIG. 5 discharges the second node n2 of the second stage ST2 with the discharging voltage VSS in response to the second output pulse Vout2 from the second stage ST2.

Figure 6:
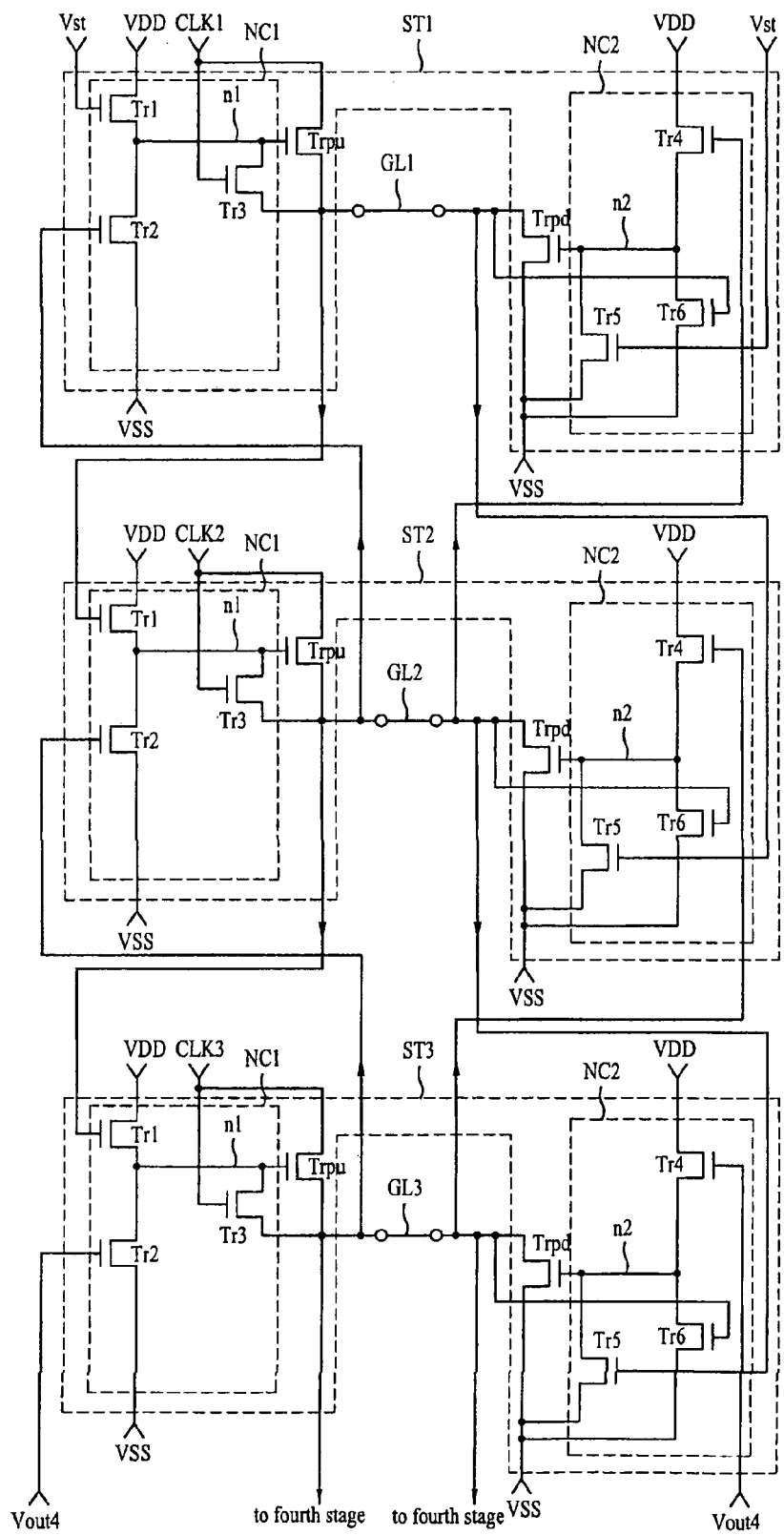
FIG. 6 is a circuit diagram of first to third stages each having the circuit configuration of FIG. 5.

The operation of the shift register with the above-stated circuit configuration will be described in further detail. FIG. 6 is a circuit diagram of the first to third stages each having the circuit configuration of FIG. 5. First, a description will be given of an operation in the initial period T0. In the initial period T0, only the start pulse Vst is maintained at the high state and the clock pulses CLK1 to CLK4 are maintained at the low state, as shown in FIG. 3. The start pulse Vst is inputted to the first stage ST1. In particular, the start pulse Vst is supplied to the gate terminal of the first switching device Tr1 of the first stage ST1 and the gate terminal of the fifth switching device Tr5 of the first stage ST1, as shown in FIG. 6. As a result, the first switching device Tr1 of the first stage ST1 is turned on and the charging voltage VDD is supplied to the first node n1 of the first stage ST1 through the turned-on first switching device Tr1. Consequently, the first node n1 of the first stage ST1 is charged by the charging voltage VDD, and the pull-up switching device Trpu with its gate terminal connected to the charged first node n1 is turned on. The fifth switching device Tr5 of the first stage ST1, supplied with the start pulse Vst, is also turned on and the discharging voltage VSS is supplied to the second node n2 of the first stage ST1 through the turned-on fifth switching device Tr5. Consequently, the second node n2 of the first stage ST1 is discharged by the discharging voltage VSS and the pull-down switching device Trpd with its gate terminal connected to the discharged second node n2 is turned off. Meanwhile, because there is no output pulse from the second to dummy stages ST2 to STn+1 in the initial period T0, the second switching device Tr2 and fourth switching device Tr4 of the first stage ST1 remain turned off. On the other hand, the start pulse Vst outputted in the initial period T0 is supplied to the gate terminal of the second switching device Tr2 of the dummy stage STn+1 and the gate terminal of the fourth switching device Tr4 of the dummy stage STn+1. As a result, the second and fourth switching devices Tr2 and Tr4 are turned on. Then, the discharging voltage VSS is supplied to the first node n1 of the dummy stage STn+1 through the turned-on second switching device Tr2, and the charging voltage VDD is supplied to the second node n2 of the dummy stage STn+1 through the turned-on fourth switching device Tr4. Consequently, in the initial period T0, the first node n1 of the dummy stage STn+1 is discharged and the second node n2 thereof is charged.

Next, a description will be given of an operation in the first period T1. In the first period T1, only the first clock pulse CLK1 is maintained at the high state, and the remaining clock pulses CLK2 to CLK4, including the start pulse Vst, are maintained at the low state, as shown in FIG. 3. Hence, the first switching device Tr1 and fifth switching device Tr5 of the first stage ST1 are turned off in response to the start pulse Vst of the low state. As the first switching device Tr1 is turned off, the first node n1 of the first stage ST1 floats. As a result, the first node n1 of the first stage ST1 is kept charged by the charging voltage VDD applied thereto in the initial period T0, thereby causing the pull-up switching device Trpu of the first stage ST1 with its gate terminal connected to the first node n1 to remain turned on. At this time, the first clock pulse CLK1 is supplied to the drain terminal of the turned-on pull-up switching device Trpu, so that the charging voltage VDD charged at the first node n1 of the first stage ST1 is amplified (bootstrapped). This amplification results from the floating of the first node n1. Consequently, the first clock pulse CLK1 supplied to the drain terminal of the pull-up switching device Trpu of the first stage ST1 is stably outputted through the source terminal of the pull-up switching device Trpu. This first clock pulse CLK1 outputted from the pull-up switching device Trpu is the first output pulse Vout1. The outputted first output pulse Vout1 is supplied to the first gate line GL1 to function as the scan pulse to drive the first gate line GL1. The first clock pulse CLK1 outputted in the first period T1 is also supplied to the gate terminal of the third switching device Tr3 of the first stage ST1. As a result, the third switching device Tr3 is turned on, thereby causing the first node n1 of the first stage ST1 and the source terminal of the pull-up switching device Trpu to be shorted to each other. In the first period T1 all the first node n1 of the first stage ST1 and the drain terminal and source terminal of the pull-up switching device Trpu assume the high state, since the first clock pulse CLK1 of the high state is outputted from the pull-up switching device Trpu. The third switching device Tr3 has no effect on the output of the pull-up switching device Trpu when the first node n1 is in its charged state. However, when the first node n1 floats in its discharged state, the third switching device Tr3 functions to stabilize the signal state of the first node n1 by periodically supplying the discharging voltage VSS to the first node n1, which will be described later in detail. Meanwhile, the first output pulse Vout1 outputted from the pull-up switching device Trpu of the first stage ST1 is supplied to the second stage ST2 to function as the start pulse Vst to charge the first node n1 of the second stage ST2 and discharge the second node n2 thereof. In other words, the first output pulse Vout1 outputted from the first stage ST1 in the first period T1 is supplied to the gate terminals of the first and fifth switching devices Tr1 and Tr5 of the second stage ST2. At this time, the first output pulse Vout1 is supplied to the gate terminal of the fifth switching device Tr5 through the first gate line GL1. As a result, the first and fifth switching devices Tr1 and Tr5 of the second stage ST2 are turned on. Consequently, the first node n1 of the second stage ST2 is charged by the charging voltage VDD, and the pull-up switching device Trpu of the second stage ST2 with its gate terminal connected to the charged first node n1 is turned on. On the other hand, the second and fourth switching devices Tr2 and Tr4 of the second stage ST2 remain turned off since there is no output pulse from the third to dummy stages ST3 to STn+1 in the first period T1.

Next, a description will be given of an operation in the second period T2. In the second period T2, only the second clock pulse CLK2 is maintained at the high state, whereas the remaining clock pulses CLK1, CLK3 and CLK4, including the start pulse Vst, and the first output pulse Vout1 are maintained at the low state. Accordingly, the first and fifth switching devices Tr1 and Tr5 of the second stage ST2 are turned off in response to the first output pulse Vout1 of the low state. As the first switching device Tr1 is turned off, the first node n1 of the second stage ST2 floats. As a result, the first node n1 of the second stage ST2 is kept charged by the charging voltage VDD applied thereto in the first period T1, so that the pull-up switching device Trpu of the second stage ST2 with its gate terminal connected to the first node n1 remains turned on. At this time, the second clock pulse CLK2 is supplied to the drain terminal of the turned-on pull-up switching device Trpu, thereby causing the charging voltage VDD charged at the first node n1 of the second stage ST2 to be amplified. Consequently, the second clock pulse CLK2 supplied to the drain terminal of the pull-up switching device Trpu of the second stage ST2 is stably outputted through the source terminal of the pull-up switching device Trpu. This second clock pulse CLK2 outputted from the pull-up switching device Trpu is the second output pulse Vout2. The outputted second output pulse Vout2 is supplied not only to the second gate line GL2 to function as the scan pulse to drive the second gate line GL2, but also to the third stage ST3 to function as the start pulse Vst to charge the first node n1 of the third stage ST3 and discharge the second node n2 thereof. The second output pulse Vout2 outputted from the second stage ST2 in the second period T2 is also supplied to the first stage ST1 to discharge the first node n1 of the first stage ST1 and charge the second node n2 thereof. In other words, the first stage ST1 is disabled in response to the second output pulse Vout2 from the second stage ST2, which will hereinafter be described in detail. The second output pulse Vout2 outputted from the second stage ST2 in the second period T2 is supplied to the gate terminal of the fourth switching device Tr4 of the first stage ST1 through the second gate line GL2, as well as to the gate terminal of the second switching device Tr2 of the first stage ST1. As a result, the second switching device Tr2 is turned on and the discharging voltage VSS is supplied to the first node n1 of the first stage S1 through the turned-on second switching device Tr2, thus turning off the pull-up switching device Trpu with its gate terminal connected to the discharged first node n1 of the first stage ST1. The fourth switching device Tr4 of the first stage ST1, supplied with the second output pulse Vout2, is also turned on and the charging voltage VDD is supplied to the second node n2 of the first stage ST1 through the turned-on fourth switching device Tr4. Accordingly, the second node n2 is charged and the pull-down switching device Trpd of the first stage ST1 with its gate terminal connected to the charged second node n2 is turned on. The discharging voltage VSS is supplied to the first gate line GL1 through the turned-on pull-down switching device Trpd. Consequently, the first gate line GL1 is discharged. In this manner, the second stage ST2 outputs the second output pulse Vout2 in the second period T2. This second output pulse Vout2 drives the second gate line GL2, enables the third stage ST3 and disables the first stage ST1. In the same manner, the third and fourth stages ST3 and ST4 output the third and fourth output pulses Vout3 and Vout4 in third and fourth periods T3 and T4, respectively.

Thereafter, in a fifth period T5, only the first clock pulse CLK1 is again maintained at the high state. The first clock pulse CLK1 outputted in the fifth period T5 is supplied to the fifth stage ST5. Then, the fifth stage ST5 outputs the fifth output pulse Vout5 using the first clock pulse CLK1 and supplies it to the fifth gate line, fourth stage and sixth stage. The first clock pulse CLK1 outputted in the fifth period T5 is also supplied to the first stage ST1. In detail, the first clock pulse CLK1 is supplied to the drain terminal of the pull-up switching device Trpu of the first stage ST1 and the gate terminal of the third switching device Tr3 of the first stage ST1. In this fifth period T5, the pull-up switching device Trpu remains turned off since the first node n1 of the first stage ST1 is in its discharged state. As a result, the pull-up switching device Trpu of the first stage ST1 generates no output in the fifth period T5. Meanwhile, the third switching device Tr3 of the first stage ST1 is turned on by the first clock pulse CLK1. Thus, the discharging voltage VSS of the first gate line GL1 is supplied to the first node n1 of the first stage ST1 through the turned-on third switching device Tr3. At this time, the discharging voltage VSS is continuously supplied to the first gate line GL1 through the pull-down switching device Trpd of the first stage ST1. The pull-down switching device Trpd of the first stage ST1 is kept turned on from the second period T2 until the end of a period of one frame including the second period T2. The reason is that the second node n2 of the first stage ST1, to which the gate terminal of the pull-down switching device Trpd is connected, is kept charged by the charging voltage VDD from the second period T2 until the end of the period of one frame. As a result, the discharging voltage VSS is maintained on the first gate line GL1 continuously after the second period T2. The third switching device Tr3 of the first stage ST1 is turned on periodically whenever the first clock pulse CLK1 is outputted. The discharging voltage VSS is periodically supplied from the first gate line GL1 to the first node n1 of the first stage ST1 through the turned-on third switching device Tr3. Consequently, the first node n1 of the first stage ST1 is stably maintained in its discharged state after the first stage ST1 outputs the first output pulse Vout1. In this manner, the third switching device Tr3 of each of the stages ST1 to STn+1 functions to stabilize the output of the corresponding stage. As an alternative, a clock pulse may be supplied to the drain terminal of the first switching device Tr1 of each of the stages ST1 to STn instead of the charging voltage VDD. In this case, the clock pulse supplied to the drain terminal of the first switching device Tr1 of the kth stage is the same as that supplied to the drain terminal of the pull-up switching device Trpu of the (k–1)th stage. Therefore, it is possible to simplify the circuit configuration by removing the first charging voltage line DDL1 which supplies the charging voltage VDD to the first node controller NC1.

Figure 7:
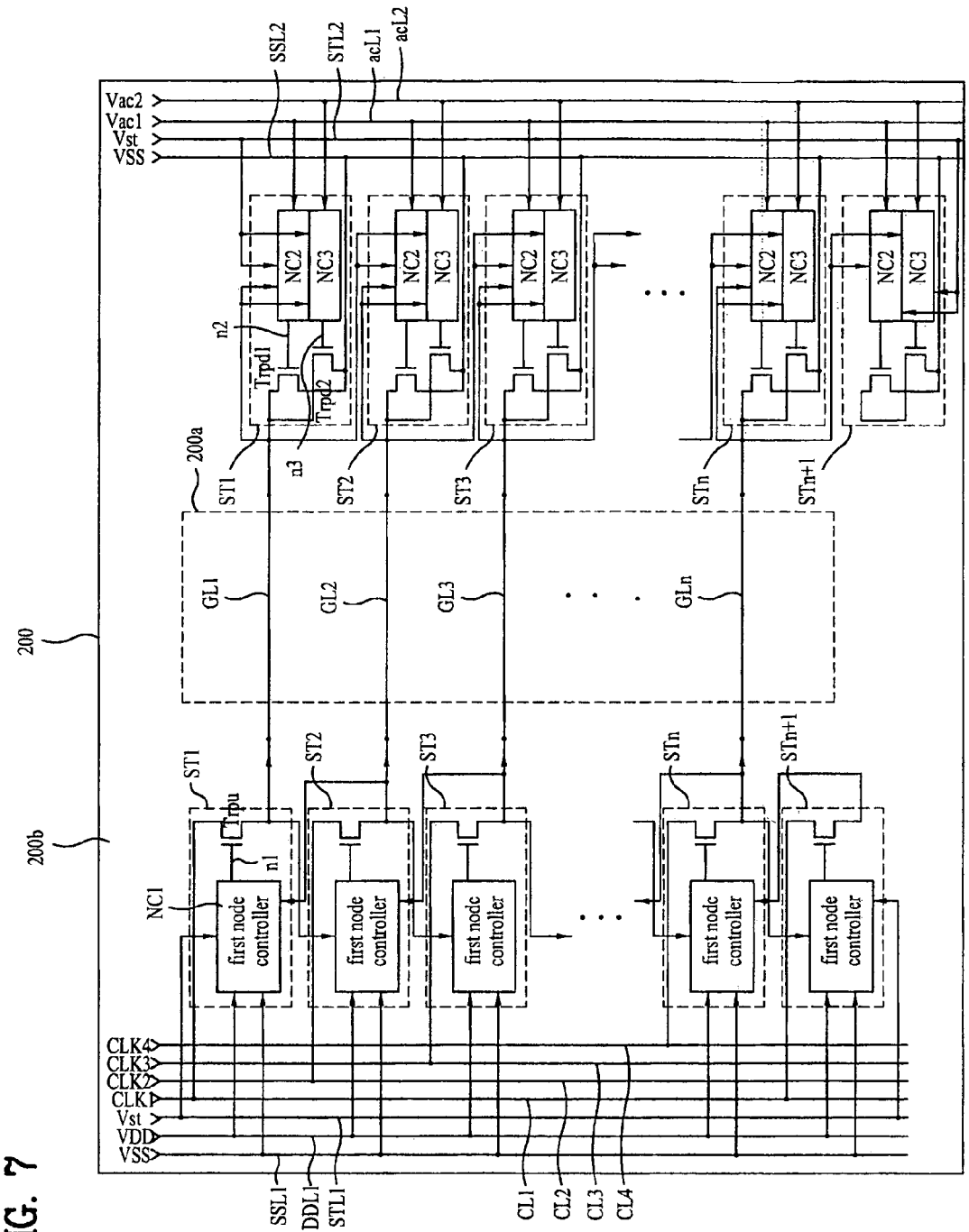
FIG. 7 is a schematic view of a shift register according to a second exemplary embodiment of the present invention.
Figure 8:
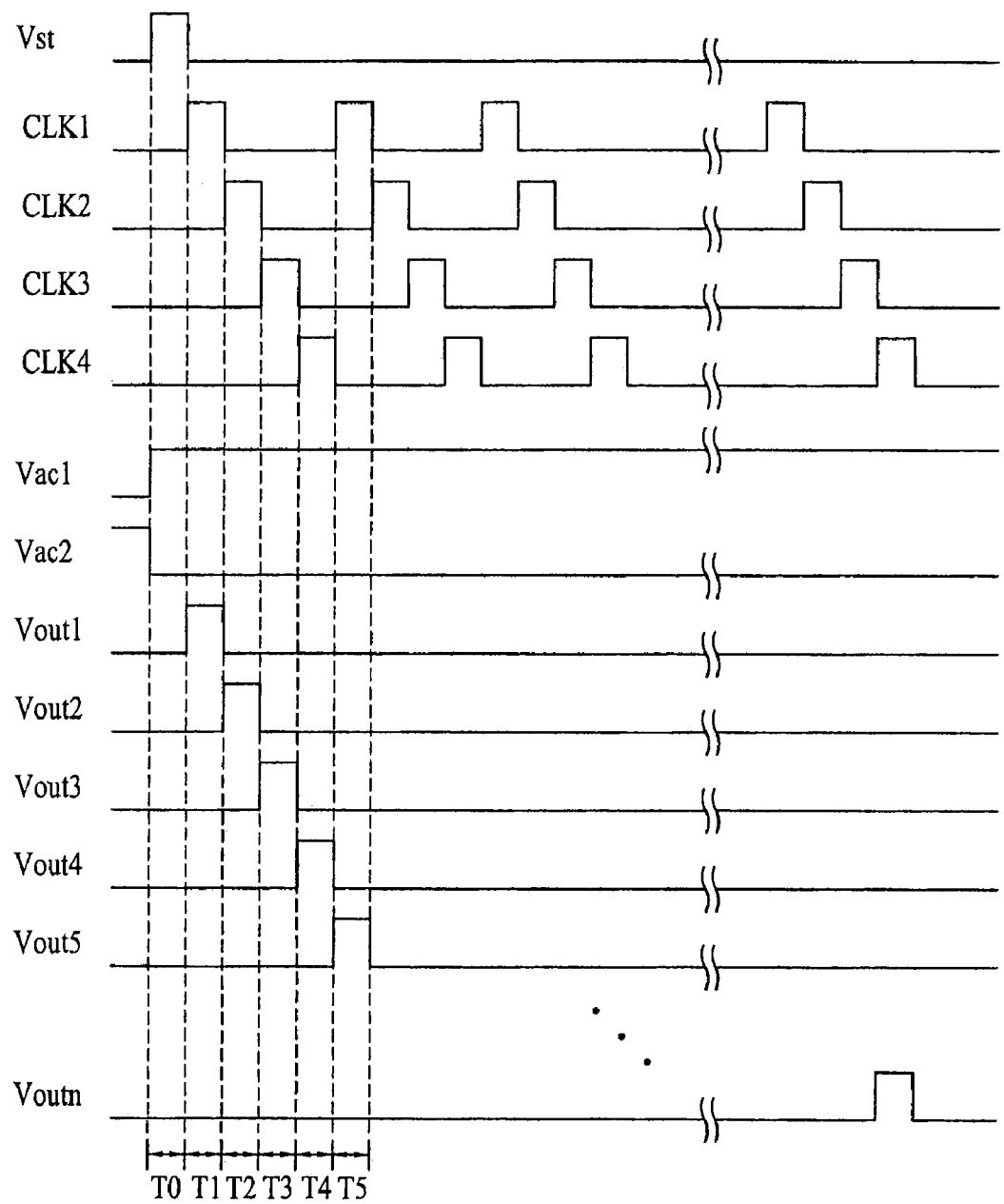
FIG. 8 is a timing diagram of various signals supplied to the shift register of FIG. 7 and output pulses outputted therefrom.

FIG. 7 schematically shows the configuration of a shift register according to a second exemplary embodiment of the present invention. FIG. 8 is a timing diagram of various input signals supplied to the shift register of FIG. 7 and output pulses outputted therefrom. As shown in FIG. 7, the shift register according to the second exemplary embodiment of the present invention comprises a plurality of stages ST1 to STn, and a dummy stage STn+1. Each of the stages ST1 to STn+1 includes a first node n1, a second node n2, a third node n3, a first node controller NC1, a second node controller NC2, a third node controller NC3, a pull-up switching device Trpu, a first pull-down switching device Trpd1, and a second pull-down switching device Trpd2. The first node n1, first node controller NC1 and pull-up switching device Trpu of each of the stages ST1 to STn+1 are formed at the left side of a display region 200a of a liquid crystal panel 200. The second node n2, third node n3, second node controller NC2, third node controller NC3, first pull-down switching device Trpd1 and second pull-down switching device Trpd2 of each of the stages ST1 to STn+1 are formed at the right side of the display region 200a.

The first node controller NC1 controls the signal state of the first node n1. In other words, the first node controller NC1 charges or discharges the first node n1. The second node controller NC2 controls the signal state of the second node n2. In other words, the second node controller NC2 charges or discharges the second node n2. The third node controller NC3 controls the signal state of the third node n3. In other words, the third node controller NC3 charges or discharges the third node n3. The first to third node controllers NC1 to NC3 cooperate to keep both the second and third nodes n2 and n3 discharged when the first node n1 is in its charged state. The first to third node controllers NC1 to NC3 also cooperate to keep any one of the second node n2 and third node n3 charged and the other discharged when the first node n1 is in its discharged state. Preferably, the second and third nodes n2 and n3 are alternately charged (or discharged) at intervals of p frame periods (p is a natural number). For example, provided that the second node n2 is kept charged in an odd frame period and discharged in an even frame period, the third node n3 is kept discharged in the odd frame period and charged in the even frame period. The pull-up switching device Trpu of the kth stage is turned on or off according to the signal state of the first node n1 of the kth stage, and outputs a clock pulse supplied from a clock transfer line as an output pulse when being turned on. This output pulse is then supplied to one side of the kth gate line, the second and third node controllers NC2 and NC3 of the kth stage, and the first to third node controllers NC1 to NC3 of the (k+1)th stage. The first pull-down switching device Trpd1 of the kth stage is turned on or off according to the signal state of the second node n2 of the kth stage, and supplies a discharging voltage VSS to the other side of the kth gate line when being turned on. The second pull-down switching device Trpd2 of the kth stage is turned on or off according to the signal state of the third node n3 of the kth stage, and supplies the discharging voltage VSS to the other side of the kth gate line when being turned on.

The first node controller NC1 of the kth stage charges the first node n1 of the kth stage with a charging voltage VDD (or clock pulse) in response to the output pulse from the pull-up switching device Trpu of the (k–1)th stage. The second node controller NC2 of the kth stage discharges the second node n2 of the kth stage with the discharging voltage VSS in response to the output pulse from the pull-up switching device Trpu of the (k−1)th stage. At this time, the second node controller NC2 of the kth stage receives the output pulse from the pull-up switching device Trpu of the (k−1)th stage through the (k−1)th gate line. In other words, the (k−1)th output pulse outputted from the pull-up switching device Trpu of the (k−1)th stage is supplied to the second node controller NC2 of the kth stage via the (k−1)th gate line. The third node controller NC3 of the kth stage discharges the third node n3 of the kth stage with the discharging voltage VSS in response to the output pulse from the pull-up switching device Trpu of the (k−1)th stage. At this time, the third node controller NC3 of the kth stage receives the output pulse from the pull-up switching device Trpu of the (k−1)th stage through the (k−1)th gate line. In other words, the (k−1)th output pulse outputted from the pull-up switching device Trpu of the (k−1)th stage is supplied to the third node controller NC3 of the kth stage via the (k−1)th gate line.

On the other hand, because there is no stage in the front of the first stage ST1, the first node controller NC1 of the first stage ST1 charges the first node n1 of the first stage ST1 with the charging voltage VDD in response to a start pulse Vst supplied from a start transfer line. The second and third node controllers NC2 and NC3 of the first stage ST1 discharge the second and third nodes n2 and n3 of the first stage ST1 with the discharging voltage VSS in response to the start pulse Vst from the start transfer line, respectively. The first node controller NC1 of the kth stage discharges the first node n1 of the kth stage with the discharging voltage VSS in response to the output pulse from the pull-up switching device Trpu of the (k+1)th stage. The second node controller NC2 of the kth stage charges the second node n2 of the kth stage with a first alternating current (AC) voltage Vac1 of a high state or discharges the second node n2 of the kth stage with the first AC voltage Vac1 of a low state (or the discharging voltage VSS) according to the logic state of the first AC voltage Vac1, the charged/discharged state of the kth gate line, and the presence/absence of an output from the (k−1)th stage. In particular, when the kth gate line is in its charged state or when there is an output from the (k−1)th stage, the second node controller NC2 of the kth stage discharges the second node n2 of the kth stage irrespective of the logic state of the first AC voltage Vac1. When the kth gate line is in its discharged state and there is no output from the (k−1)th stage, the second node controller NC2 of the kth stage charges or discharges the second node n2 of the kth stage according to the logic state of the first AC voltage Vac1. The third node controller NC3 of the kth stage charges the third node n3 of the kth stage with the first AC voltage Vac1 of the high state or discharges the third node n3 of the kth stage with the first AC voltage Vac1 of the low state (or the discharging voltage VSS) according to the logic state of a second AC voltage Vac2, the charged/discharged state of the kth gate line, and the presence/absence of an output from the (k−1)th stage. In particular, when the kth gate line is in its charged state or when there is an output from the (k−1)th stage, the third node controller NC3 of the kth stage discharges the third node n3 of the kth stage irrespective of the logic state of the second AC voltage Vac2. When the kth gate line is in its discharged state and there is no output from the (k−1)th stage, the third node controller NC3 of the kth stage charges or discharges the third node n3 of the kth stage according to the logic state of the second AC voltage Vac2.

The first AC voltage Vac1 and the second AC voltage Vac2 have inverted phases for each frame period. Preferably, the first and second AC voltages Vac1 and Vac2 are inverted in phase at intervals of p frame periods (p is a natural number). For example, provided that the first AC voltage Vac1 is maintained at the high state in an odd frame period and at the low state in an even frame period, the second AC voltage Vac2 is maintained at the low state in the odd frame period and at the high state in the even frame period. On the other hand, because there is no stage in the rear of the dummy stage STn+1, the first node controller NC1 of the dummy stage STn+1 discharges the first node n1 of the dummy stage STn+1 with the discharging voltage VSS in response to the start pulse Vst supplied from the start transfer line. The second and third node controllers NC2 and NC3 of the dummy stage STn+1 charge any one of the second and third nodes n2 and n3 of the dummy stage STn+1 and discharge the other in response to the start pulse Vst from the start transfer line.

In a portion of the non-display region 200b located at the left side of the display region 200a, first to fourth clock transfer lines CL1 to CL4 which transfer first to fourth clock pulses CLK1 to CLK4, respectively, a first start transfer line STL1 which transfers the start pulse Vst, a first charging voltage line DDL1 which transfers the charging voltage VDD, and a first discharging voltage line SSL1 which transfers the discharging voltage VSS are formed. On the other hand, in a portion of the non-display region 200b located at the right side of the display region 200a are a second start transfer line STL2 which transfers the start pulse Vst, a second discharging voltage line SSL2 which transfers the discharging voltage VSS, a first AC voltage line acL1 which transfers the first AC voltage Vac1, and a second AC voltage line acL2 which transfers the second AC voltage Vac2 are formed. The first to fourth clock pulses CLK1 to CLK4, the start pulse Vst, the charging voltage VDD and the discharging voltage VSS are the same as those in the first exemplary embodiment. Therefore, a detailed description thereof will be omitted. A four-phase clock pulse is supplied to the shift register according to the second exemplary embodiment of the present invention. Thus, the following clock pulse is supplied to the drain terminal of the pull-up switching device Trpu in each of the stages ST1 to STn+1. In other words, the pull-up switching devices Trpu of the (4g+1)th stages are supplied with the first clock pulse CLK1, and the pull-up switching devices Trpu of the (4g+2)th stages are supplied with the second clock pulse CLK2. The pull-up switching devices Trpu of the (4g+3)th stages are supplied with the third clock pulse CLK3, and the pull-up switching devices Trpu of the (4g+4)th stages are supplied with the fourth clock pulse CLK4.

The operation of the shift register with the above-stated configuration according to the second exemplary embodiment of the present invention will hereinafter be described. First, a description will be given of an operation in an initial period T0. Here, assume that, for a first frame period, the first AC voltage Vac1 is maintained at the high state and the second AC voltage Vac2 is maintained at the low state. One frame period includes the initial period T0 to ith period (i is a natural number).

In the initial period T0, only the start pulse Vst is maintained at the high state and the clock pulses CLK1 to CLK4 are maintained at the low state. The first stage ST1 is operated in response to the start pulse Vst of the high state. In other words, in response to the start pulse Vst, the first node controller NC1 of the first stage ST1 charges the first node n1 of the first stage ST1 with the charging voltage VDD (or clock pulse). Also, in response to the start pulse Vst, the second node controller NC2 of the first stage ST1 discharges the second node n2 of the first stage ST1 with the discharging voltage VSS. The third node controller NC3 of the first stage ST1 discharges the third node n3 of the first stage ST1 with the discharging voltage VSS. Then, the pull-up switching device Trpu of the first stage ST1, the gate terminal of which is connected to the charged first node n1, is turned on. Furthermore, the first pull-down switching device Trpd1 of the first stage ST1, the gate terminal of which is connected to the discharged second node n2, is turned off. Lastly, the second pull-down switching device Trpd2 of the first stage ST1, the gate terminal of which is connected to the discharged third node n3, is turned off. The start pulse Vst is also supplied to the first to third node controllers NC1 to NC3 of the dummy stage STn+1. At this time, the first node controller NC1 of the dummy stage STn+1 turns off the pull-up switching device Trpu of the dummy stage STn+1. The second node controller NC2 of the dummy stage STn+1 turns on the first pull-down switching device Trpd1 of the dummy stage STn+1 using the first AC voltage Vac1. The third node controller NC3 of the dummy stage STn+1 turns off the second pull-down switching device Trpd2 of the dummy stage STn+1 using the second AC voltage Vac2.

Next, a description will be given of an operation in a first period T1. In the first period T1, only the first clock pulse CLK1 is maintained at the high state and the remaining clock pulses CLK2 to CLK4, including the start pulse Vst, are maintained at the low state. The first clock pulse CLK1 is supplied to the pull-up switching devices Trpu of the (4g+1)th stages. At this time, the pull-up switching device Trpu of only the first stage ST1, among the (4g+1)th stages, is turned on since only the first stage ST1 is a stage in which the first node n1 is charged (i.e., an enabled stage). The pull-up switching devices Trpu of the remaining stages are turned off. Thus, in the first period T1, only the pull-up switching device Trpu of the first stage ST1 outputs the first clock pulse CLK1. This first clock pulse CLK1 outputted from the pull-up switching device Trpu of the first stage ST1 is the first output pulse Vout1. The first output pulse Vout1 functions not only as a first scan pulse to drive the first gate line GL1, but also as a start pulse to enable the next stage, or second stage ST2. In other words, the first output pulse Vout1 outputted in the first period T1 is supplied to the first to third node controllers NC1 to NC3 of the second stage ST2. As a result, the first node n1 of the second stage ST2 is charged and the second and third nodes n2 and n3 thereof are discharged. Here, the first output pulse Vout1 is supplied to the second and third node controllers NC2 and NC3 of the second stage ST2 through the first gate line GL1. The first output pulse Vout1 is also supplied through the first gate line GL1 to the second and third node controllers NC2 and NC3 of the first stage ST1 disposed at the opposite side. In response to this first output pulse Vout1, the second node controller NC2 discharges the second node n2 of the first stage ST1, and the third node controller NC3 discharges the third node n3 of the first stage ST1.

Next, a description will be given of an operation in a second period T2. In the second period T2, only the second clock pulse CLK2 is maintained at the high state. The remaining clock pulses CLK1, CLK3 and CLK4, including the start pulse Vst, and the first output pulse Vout1 are maintained at the low state. The second clock pulse CLK2 is supplied to the pull-up switching devices Trpu of the (4g+2)th stages. At this time, the pull-up switching device Trpu of only the second stage ST2, among the (4g+2) the stages, is turned on since only the second stage ST2 is a stage in which first node n1 is charged (i.e., an enabled stage). The pull-up switching devices Trpu of the remaining stages are turned off. Accordingly, in the second period T2, only the pull-up switching device Trpu of the second stage ST2 outputs the second clock pulse CLK2. This second clock pulse CLK2 outputted from the pull-up switching device Trpu of the second stage ST2 is the second output pulse Vout2. The second output pulse Vout2 functions not only as a second scan pulse to drive the second gate line GL2, but also as a start pulse to enable the next stage, or third stage ST3. In other words, the second output pulse Vout2 outputted in the second period T2 is supplied to the first to third node controllers NC1 to NC3 of the third stage ST3. As a result, the first node n1 of the third stage ST3 is charged and the second and third nodes n2 and n3 thereof are discharged. Here, the second output pulse Vout2 is supplied to the second and third node controllers NC2 and NC3 of the third stage ST3 through the second gate line GL2. The second output pulse Vout2 is also supplied through the second gate line GL2 to the second and third node controllers NC2 and NC3 of the second stage ST2 disposed at the opposite side. In response to this second output pulse Vout2, the second node controller NC2 discharges the second node n2 of the second stage ST2, and the third node controller NC3 discharges the third node n3 of the second stage ST2.

On the other hand, in the second period T2, the first stage ST1 is disabled. In other words, in the second period T2, because the first output pulse Vout1 is maintained at the low state, the first gate line GL1 is discharged. The start pulse Vst is also maintained at the low state in the second period T2. As the first gate line GL1 is maintained in its charged state and the start pulse Vst is maintained at the low state, the second node controller NC2 of the first stage ST1, supplied with the first AC voltage Vac1 of the high state, is operated. In other words, the second node controller NC2 charges the second node n2 of the first stage ST1 with the first AC voltage Vac1 of the high state. In contrast, the third node controller NC3 of the first stage ST1, supplied with the second AC voltage Vac1 of the low state, is not operated. As a result, the third node controller NC3 of the first stage ST1 remains discharged by the discharging voltage VSS supplied in the previous period. Then, the first pull-down switching device Trpd1 of the first stage ST1 with its gate terminal connected to the charged second node n2 is turned on and the second pull-down switching device Trpd2 of the first stage ST1 with its gate terminal connected to the discharged third node n3 is turned off. Consequently, the discharging voltage VSS is supplied to the first gate line GL1 through the turned-on first pull-down switching device Trpd1, thereby causing the first gate line GL1 to be discharged.

In this manner, each of the stages ST1 to STn is enabled in response to the output pulse from the previous stage, so as to output the clock pulse supplied thereto after being enabled. Each of the stages ST1 to STn is also disabled in response to the output pulse from the next stage, so as to discharge the corresponding gate line. In a second frame period, the first AC voltage Vac1 is maintained at the low state and the second AC voltage Vac2 is maintained at the high state. Thus, when each of the stages ST1 to STn is disabled, the third node controller NC3 is operated, thereby causing the third node n3 to be charged and the second node n2 to be discharged. As a result, in the second frame period, the second pull-down switching device Trpd2 connected to the third node n3 is operated. In this manner, the second node n2 and the third node n3 are alternately charged, so that, when one pull-down switching device is operated, the other pull-down switching device enters an idle state. Accordingly, it is possible to prevent the first and second pull-down switching devices Trpd1 and Trpd2 from being deteriorated.

Figure 9:
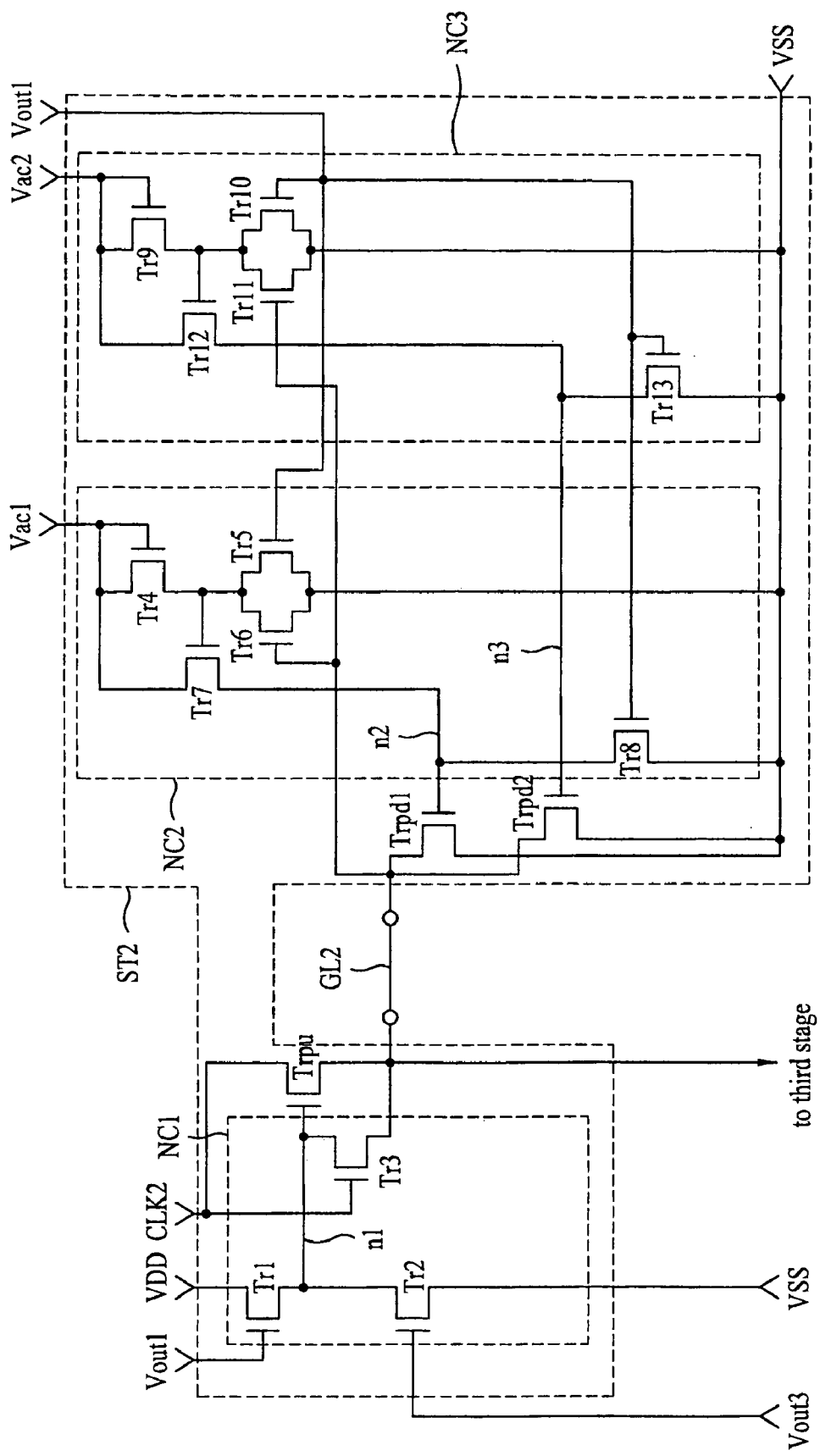
FIG. 9 is a circuit diagram showing the circuit configuration of one exemplary embodiment of a second stage in FIG. 7.

Now, circuit diagrams, including the stages ST1 to STn+1, that performs the operation described above will be described. FIG. 9 is a circuit diagram showing the circuit configuration of one exemplary embodiment of the second stage ST2 in FIG. 7. The first node controller NC1 of each of the stages ST1 to STn+1 includes first to third switching devices Tr1 to Tr3. The first to third switching devices Tr1 to Tr3 in FIG. 9 are the same as those in FIG. 4, and a description thereof will thus be omitted.

As shown in FIG. 9, the second node controller NC2 of each of the stages ST1 to STn+1 includes fourth to eighth switching devices Tr4 to Tr8. The fourth switching device Tr4 of the second node controller NC2 of the kth stage acts to output the first AC voltage Vac1 in response to the first AC voltage Vac1 and supply it to the gate terminal of the seventh switching device Tr7.

The fourth switching device Tr4 of the kth stage has a gate terminal and drain terminal connected in common to the first AC voltage line acL1, and a source terminal connected to the gate terminal of the seventh switching device Tr7. For example, the fourth switching device Tr4 of the second stage ST2 of FIG. 9 outputs the first AC voltage Vac1 in response to the first AC voltage Vac1 and supplies it to the gate terminal of the seventh switching device Tr7.

The fifth switching device Tr5 of the second node controller NC2 of the kth stage outputs the discharging voltage VSS in response to the output pulse from the (k−1)th stage and supplies it to the gate terminal of the seventh switching device Tr7. The fifth switching device Tr5 of the kth stage has a gate terminal connected to the source terminal of the pull-up switching device Trpu of the (k−1)th stage through the (k−1)th gate line, a drain terminal connected to the gate terminal of the seventh switching device Tr7, and a source terminal connected to the second discharging voltage line SSL2. For example, the fifth switching device Tr5 of the second stage ST2 of FIG. 9 outputs the discharging voltage VSS in response to the first output pulse from the first stage ST1 and supplies it to the gate terminal of the seventh switching device Tr7.

The sixth switching device Tr6 of the second node controller NC2 of the kth stage outputs the discharging voltage VSS in response to the output pulse from the kth stage and supplies it to the gate terminal of the seventh switching device Tr7. The sixth switching device Tr6 of the kth stage has a gate terminal connected to the source terminal of the pull-up switching device Trpu of the kth stage through the kth gate line, a drain terminal connected to the gate terminal of the seventh switching device Tr7, and a source terminal connected to the second discharging voltage line SSL2. For example, the sixth switching device Tr6 of the second stage ST2 of FIG. 9 outputs the discharging voltage VSS in response to the second output pulse from the second stage ST2 and supplies it to the gate terminal of the seventh switching device Tr7.

The seventh switching device Tr7 of the second node controller NC2 of the kth stage supplies the first AC voltage Vac1 to the second node n2 of the kth stage in response to the outputs from the fourth, fifth and sixth switching devices Tr4, Tr5 and Tr6. The seventh switching device Tr7 of the kth stage has a gate terminal connected in common to the source terminal of the fourth switching device Tr4 and the drain terminals of the fifth and sixth switching devices Tr5 and Tr6, a drain terminal connected to the first AC voltage line, and a source terminal connected to the second node n2 of the kth stage. For example, the seventh switching device Tr7 of the second stage ST2 of FIG. 9 supplies the first AC voltage Vac1 to the second node n2 of the second stage ST2 in response to the outputs from the fourth, fifth and sixth switching devices Tr4, Tr5 and Tr6.

The eighth switching device Tr8 of the second node controller NC2 of the kth stage supplies the discharging voltage VSS to the second node n2 of the kth stage in response to the output pulse from the (k−1)th stage. The eighth switching device Tr8 of the kth stage has a gate terminal connected to the source terminal of the pull-up switching device Trpu of the (k−1)th stage through the (k−1)th gate line, a drain terminal connected to the second node n2 of the kth stage, and a source terminal connected to the second discharging voltage line SSL2. For example, the eighth switching device Tr8 of the second stage ST2 of FIG. 9 supplies the discharging voltage VSS to the second node n2 of the second stage ST2 in response to the first output pulse from the first stage ST1. The third node controller NC3 of each of the stages ST1 to STn+1 includes ninth to thirteenth switching devices Tr9 to Tr13.

The ninth switching device Tr9 of the third node controller NC3 of the kth stage outputs the second AC voltage Vac2 in response to the second AC voltage Vac2 and supplies it to the gate terminal of the twelfth switching device Tr12. The ninth switching device Tr9 of the kth stage has a gate terminal and drain terminal connected in common to the second AC voltage line, and a source terminal connected to the gate terminal of the twelfth switching device Tr12. For example, the ninth switching device Tr9 of the second stage ST2 of FIG. 9 outputs the second AC voltage Vac2 in response to the second AC voltage Vac2 and supplies it to the gate terminal of the twelfth switching device Tr12.

The tenth switching device Tr10 of the third node controller NC3 of the kth stage outputs the discharging voltage VSS in response to the output pulse from the (k−1)th stage and supplies it to the gate terminal of the twelfth switching device Tr12. The tenth switching device Tr10 of the kth stage has a gate terminal connected to the source terminal of the pull-up switching device Trpu of the (k−1)th stage through the (k−1)th gate line, a drain terminal connected to the gate terminal of the twelfth switching device Tr12, and a source terminal connected to the second discharging voltage line SSL2. For example, the tenth switching device Tr10 of the second stage ST2 of FIG. 9 outputs the discharging voltage VSS in response to the first output pulse from the first stage ST1 and supplies it to the gate terminal of the twelfth switching device Tr12.

The eleventh switching device Tr11 of the third node controller NC3 of the kth stage outputs the discharging voltage VSS in response to the output pulse from the kth stage and supplies it to the gate terminal of the twelfth switching device Tr12. The eleventh switching device Tr11 of the kth stage has a gate terminal connected to the source terminal of the pull-up switching device Trpu of the kth stage through the kth gate line, a drain terminal connected to the gate terminal of the twelfth switching device Tr12, and a source terminal connected to the second discharging voltage line SSL2. For example, the eleventh switching device Tr11 of the second stage ST2 of FIG. 9 outputs the discharging voltage VSS in response to the second output pulse from the second stage ST2 and supplies it to the gate terminal of the twelfth switching device Tr12.

The twelfth switching device Tr12 of the third node controller NC3 of the kth stage supplies the second AC voltage Vac2 to the third node n3 of the kth stage in response to the outputs from the ninth, tenth and eleventh switching devices Tr9, Tr10 and Tr11. The twelfth switching device Tr12 of the kth stage has a gate terminal connected in common to the source terminal of the ninth switching device Tr9 and the drain terminals of the tenth and eleventh switching devices Tr10 and Tr11, a drain terminal connected to the second AC voltage line, and a source terminal connected to the third node n3 of the kth stage. For example, the twelfth switching device Tr12 of the second stage ST2 of FIG. 9 supplies the second AC voltage Vac2 to the third node n3 of the second stage ST2 in response to the outputs from the ninth, tenth and eleventh switching devices Tr9, Tr10 and Tr11.

The thirteenth switching device Tr13 of the third node controller NC3 of the kth stage supplies the discharging voltage VSS to the third node n3 of the kth stage in response to the output pulse from the (k−1)th stage. The thirteenth switching device Tr13 of the kth stage has a gate terminal connected to the source terminal of the pull-up switching device Trpu of the (k−1)th stage through the (k−1)th gate line, a drain terminal connected to the third node n3 of the kth stage, and a source terminal connected to the second discharging voltage line SSL2. For example, the thirteenth switching device Tr13 of the second stage ST2 of FIG. 9 supplies the discharging voltage VSS to the third node n3 of the second stage ST2 in response to the first output pulse from the first stage ST1.

Figure 10:
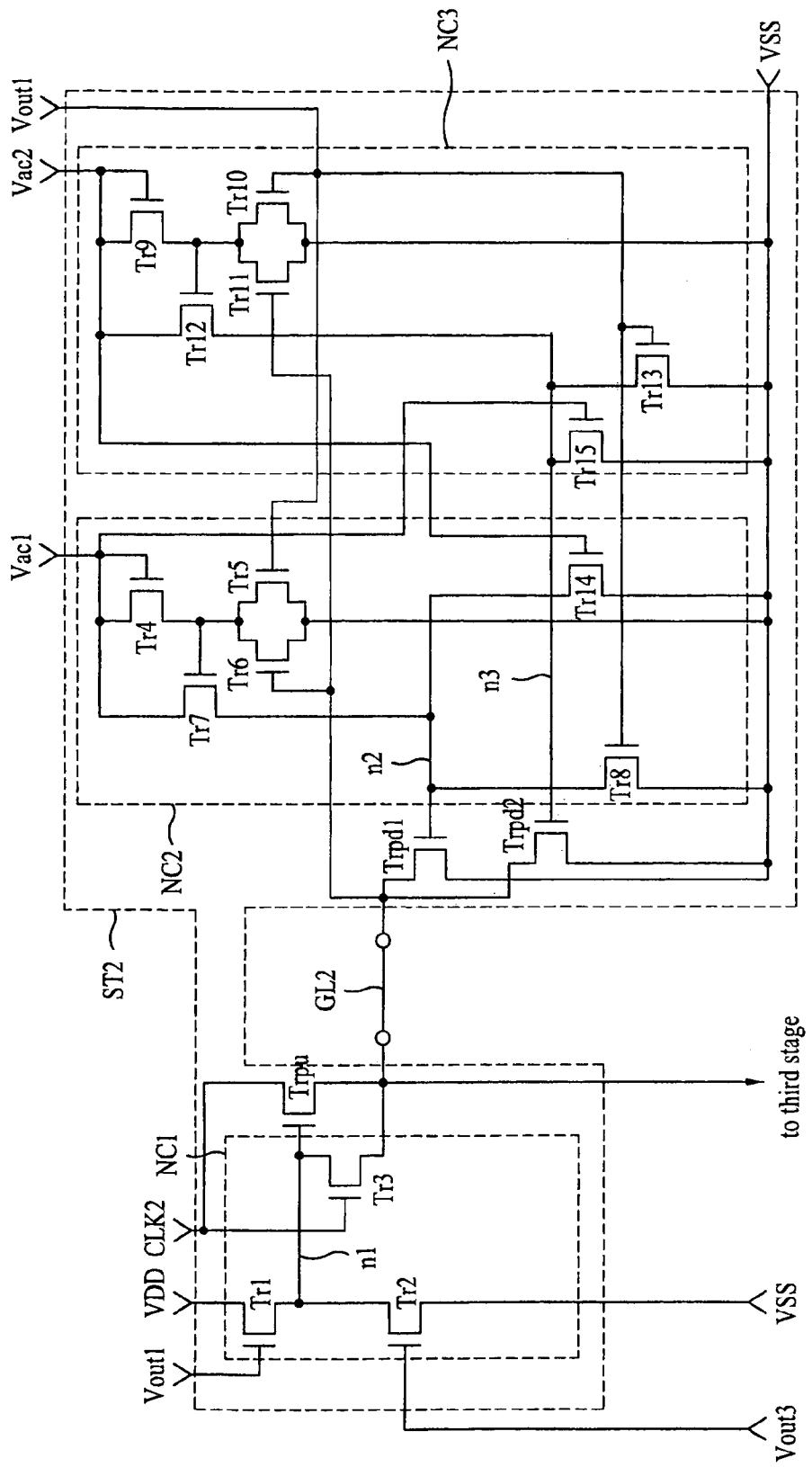
FIG. 10 is a circuit diagram showing the circuit configuration of another exemplary embodiment of the second stage in FIG. 7.

FIG. 10 is a circuit diagram showing the circuit configuration of another exemplary embodiment of the second stage ST2 in FIG. 7. In the circuit configuration of FIG. 10, the second node controller NC2 of each of the stages ST1 to STn+1 further includes a fourteenth switching device Tr14, in addition to the circuit configuration of FIG. 9. Also, as shown in FIG. 10, the third node controller NC3 of each of the stages ST1 to STn+1 further includes a fifteenth switching device Tr15.

The fourteenth switching device Tr14 of the second node controller NC2 of the kth stage supplies the discharging voltage VSS to the second node n2 of the kth stage in response to the second AC voltage Vac2. The fourteenth switching device Tr14 of the kth stage has a gate terminal connected to the second AC voltage line, a drain terminal connected to the second node n2 of the kth stage, and a source terminal connected to the second discharging voltage line SSL2. For example, the fourteenth switching device Tr14 of the second stage ST2 of FIG. 10 supplies the discharging voltage VSS to the second node n2 of the second stage ST2 in response to the second AC voltage Vac2.

The fifteenth switching device Tr15 of the third node controller NC3 of the kth stage supplies the discharging voltage VSS to the third node n3 of the kth stage in response to the first AC voltage Vac1. The fifteenth switching device Tr15 of the kth stage has a gate terminal connected to the first AC voltage line, a drain terminal connected to the third node n3 of the kth stage, and a source terminal connected to the second discharging voltage line SSL2. For example, the fifteenth switching device Tr15 of the second stage ST2 of FIG. 10 supplies the discharging voltage VSS to the third node n3 of the second stage ST2 in response to the first AC voltage Vac1.

Figure 11:
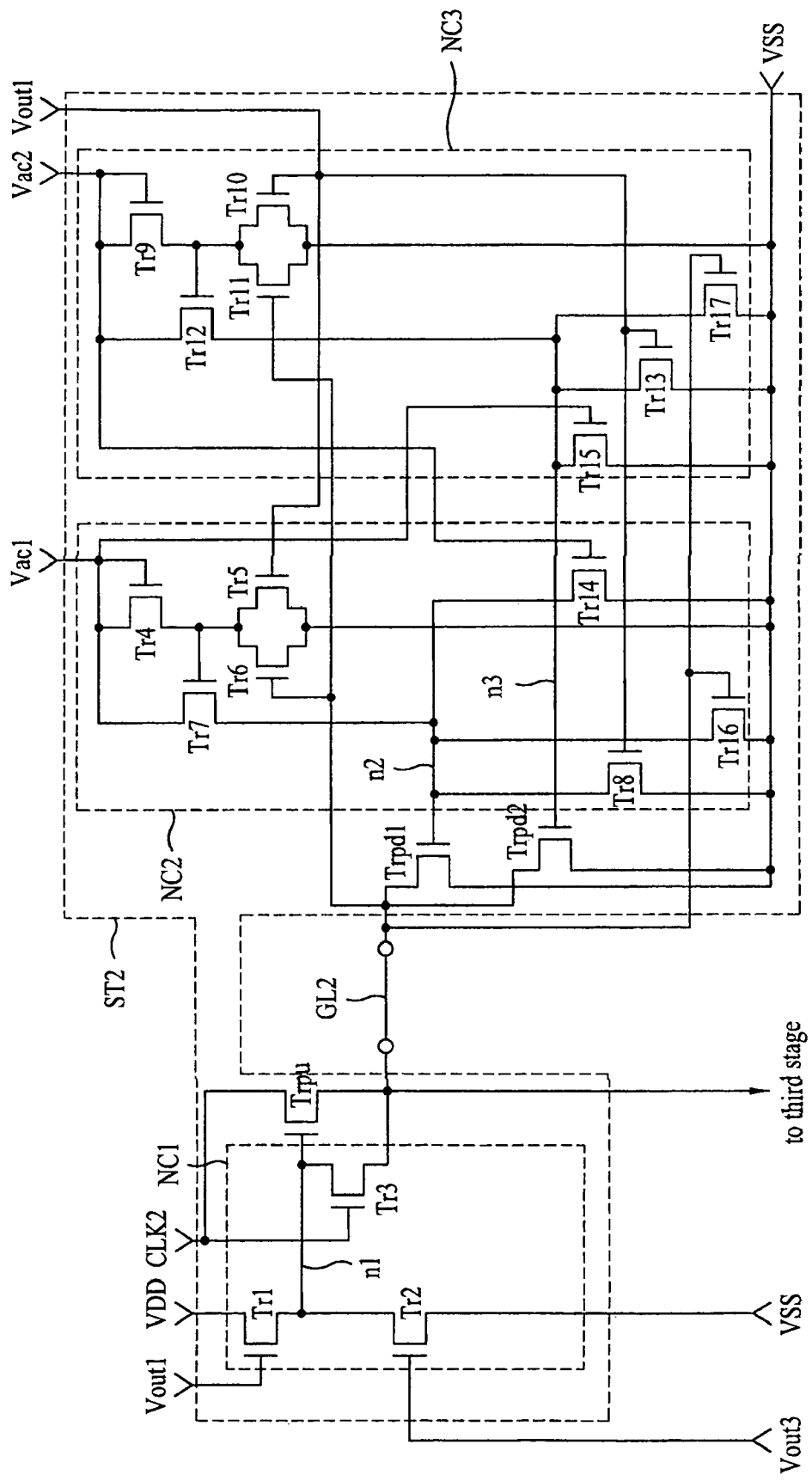
FIG. 11 is a circuit diagram showing the circuit configuration of another exemplary embodiment of the second stage in FIG. 7.

FIG. 11 is a circuit diagram showing the circuit configuration of another exemplary embodiment of the second stage ST2 in FIG. 7. In the circuit configuration of FIG. 11, the second node controller NC2 of each of the stages ST1 to STn+1 further includes a sixteenth switching device Tr16, in addition to the circuit configuration of FIG. 10. Also, as shown in FIG. 11, the third node controller NC3 of each of the stages ST1 to STn+1 further includes a seventeenth switching device Tr17.

The sixteenth switching device Tr16 of the second node controller NC2 of the kth stage supplies the discharging voltage VSS to the second node n2 of the kth stage in response to the output pulse outputted from the pull-up switching device Trpu of the kth stage. The sixteenth switching device Tr16 of the kth stage has a gate terminal connected to the source terminal of the pull-up switching device Trpu of the kth stage through the kth gate line, a drain terminal connected to the second node n2 of the kth stage, and a source terminal connected to the second discharging voltage line SSL2. For example, the sixteenth switching device Tr16 of the second stage ST2 of FIG. 11 supplies the discharging voltage VSS to the second node n2 of the second stage ST2 in response to the second output pulse outputted from the pull-up switching device Trpu of the second stage ST2.

The seventeenth switching device Tr17 of the third node controller NC3 of the kth stage supplies the discharging voltage VSS to the third node n3 of the kth stage in response to the output pulse outputted from the pull-up switching device Trpu of the kth stage. The seventeenth switching device Tr17 of the kth stage has a gate terminal connected to the source terminal of the pull-up switching device Trpu of the kth stage through the kth gate line, a drain terminal connected to the third node n3 of the kth stage, and a source terminal connected to the second discharging voltage line SSL2. For example, the seventeenth switching device Tr17 of the second stage ST2 of FIG. 11 supplies the discharging voltage VSS to the third node n3 of the second stage ST2 in response to the second output pulse outputted from the pull-up switching device Trpu of the second stage ST2.

Figure 12:
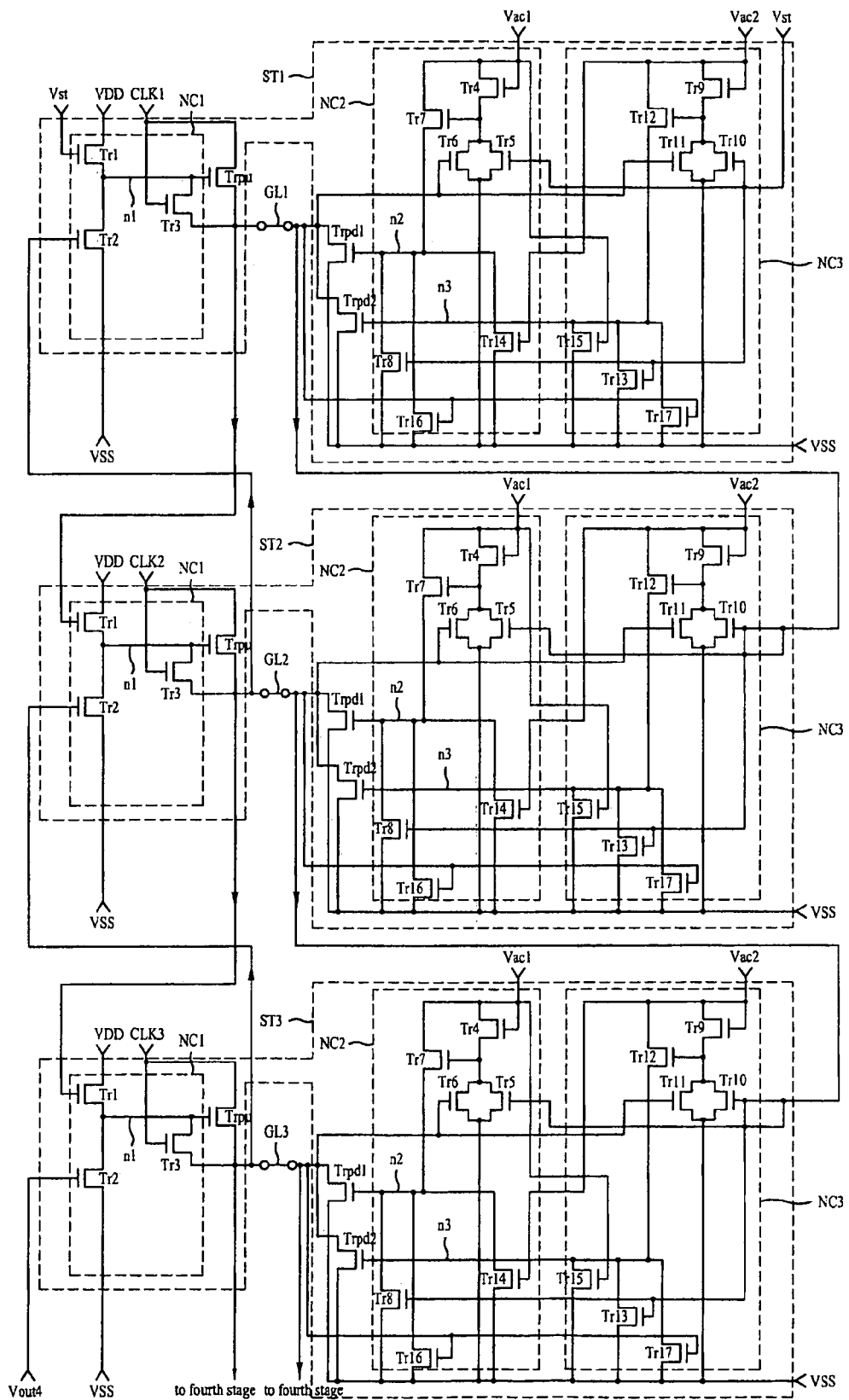
FIG. 12 is a circuit diagram of first to third stages each having the circuit configuration of FIG. 11.

Now, circuit diagrams of the circuit that performs the operation described above will be described. FIG. 12 is a circuit diagram of the first to third stages each having the circuit configuration of FIG. 11. First, a description will be given of an operation in the initial period T0. Here, assume that, for the first frame period, the first AC voltage Vac1 is maintained at the high state and the second AC voltage Vac2 is maintained at the low state. One frame period includes the initial period T0 to ith period (i is a natural number). The fourth switching device Tr4 and fifteenth switching device Tr15 of each of the stages ST1 to STn+1, supplied with the first AC voltage Vac1 through the gate terminals thereof, remain turned on for the first frame period since the first AC voltage Vac1 is maintained at the high state for the first frame period. In contrast, the ninth switching device Tr9 and fourteenth switching device Tr14 of each of the stages ST1 to STn+1, supplied with the second AC voltage Vac2 through the gate terminals thereof, remain turned off for the first frame period.

In the initial period T0, only the start pulse Vst is maintained at the high state and the clock pulses CLK1 to CLK4 are maintained at the low state, as shown in FIG. 8. The start pulse Vst is inputted to the first stage ST1. As shown in FIG. 12, the start pulse Vst is supplied to the gate terminal of the first switching device Tr1 of the first stage ST1, the gate terminal of the fifth switching device Tr5, the gate terminal of the tenth switching device Tr10, the gate terminal of the eighth switching device Tr8, and the gate terminal of the thirteenth switching device Tr13. Accordingly, the first, fifth, tenth, eighth and thirteenth switching devices Tr1, Tr5, Tr10, Tr8 and Tr13 of the first stage ST1 are turned on. The charging voltage VDD is supplied to the first node n1 of the first stage ST1 through the turned-on first switching device Tr1. As a result, the first node n1 of the first stage ST1 is charged by the charging voltage VDD, and the pull-up switching device Trpu with its gate terminal connected to the charged first node n1 is turned on. The discharging voltage VSS is supplied to the gate terminal of the seventh switching device Tr7 of the first stage ST1 through the turned-on fifth switching device Tr5. The first AC voltage Vac1 of the high state is also supplied to the gate terminal of the seventh switching device Tr7 through the turned-on fourth switching device Tr4. Preferably, the fifth switching device Tr5 has a channel width wider than that of the fourth switching device Tr4. As a result, the discharging voltage VSS outputted by the fifth switching device Tr5 is supplied to the gate terminal of the seventh switching device Tr7, thereby causing the seventh switching device Tr7 to be turned off. The discharging voltage VSS is supplied to the gate terminal of the twelfth switching device Tr12 through the turned-on tenth switching device Tr10, thus turning off the twelfth switching device Tr12. The discharging voltage VSS is supplied to the second node n2 through the turned-on eighth switching device Tr8. Consequently, the second node n2 of the first stage ST1 is discharged by the discharging voltage VSS, and the first pull-down switching device Trpd1 with its gate terminal connected to the discharged second node n2 is turned off. The discharging voltage VSS is supplied to the third node n3 through the turned-on thirteenth switching device Tr13. Consequently, the third node n3 of the first stage ST1 is discharged by the discharging voltage VSS, and the second pull-down switching device Trpd2 with its gate terminal connected to the discharged third node n3 is turned off. In the initial period T0, because the first gate line GL1 is kept discharged, the sixth, eleventh, sixteenth and seventeenth switching devices Tr6, Tr11, Tr16 and Tr17 with their gate terminals connected to the first gate line GL1 remain turned off. Meanwhile, because there is no output from the second stage ST2 in the initial period T0, the second switching device Tr2 of the first stage ST1 remains turned off. On the other hand, the start pulse Vst outputted in the initial period T0 is supplied to the gate terminal of the second switching device Tr2 of the dummy stage STn+1. As a result, the second switching device Tr2 is turned on. Then, the discharging voltage VSS is supplied to the first node n1 of the dummy stage STn+1 through the turned-on second switching device Tr2. Consequently, in the initial period T0, the first node n1 of the dummy stage STn+1 is discharged.

Next, a description will be given of an operation in the first period T1. In the first period T1, only the first clock pulse CLK1 is maintained at the high state, and the remaining clock pulses CLK2 to CLK4, including the start pulse Vst, are maintained at the low state, as shown in FIG. 8. Hence, the first, fifth, tenth, eighth and thirteenth switching devices Tr1, Tr5, Tr10, Tr8 and Tr13 of the first stage ST1 are turned off in response to the start pulse Vst of the low state. As the first switching device Tr1 is turned off, the first node n1 of the first stage ST1 floats. As a result, the first node n1 of the first stage ST1 is kept charged by the charging voltage VDD applied thereto in the initial period T0, thereby causing the pull-up switching device Trpu of the first stage ST1 with its gate terminal connected to the first node n1 to remain turned on. At this time, the first clock pulse CLK1 is supplied to the drain terminal of the turned-on pull-up switching device Trpu, so that the charging voltage VDD charged at the first node n1 of the first stage ST1 is amplified (bootstrapped). This amplification results from the floating of the first node n1. Consequently, the first clock pulse CLK1 supplied to the drain terminal of the pull-up switching device Trpu of the first stage ST1 is stably outputted through the source terminal of the pull-up switching device Trpu. This first clock pulse CLK1 outputted from the pull-up switching device Trpu is the first output pulse Vout1. The first clock pulse CLK1 outputted in the first period T1 is also supplied to the gate terminal of the third switching device Tr3 of the first stage ST1. As a result, the third switching device Tr3 is turned on, thereby causing the first node n1 of the first stage ST1 and the source terminal of the pull-up switching device Trpu to be shorted to each other.

In the first period T1, because the first output pulse Vout1 of the high state is outputted from the pull-up switching device Trpu, all the first node n1 of the first stage ST1 and the drain terminal and source terminal of the pull-up switching device Trpu assume the high state. The third switching device Tr3 has no effect on the output of the pull-up switching device Trpu when the first node n1 is in its charged state. However, when the first node n1 floats in its discharged state, the third switching device Tr3 functions to stabilize the signal state of the first node n1 by periodically supplying the discharging voltage VSS to the first node n1, which will be described later in detail. Meanwhile, the outputted first output pulse Vout1 is supplied to the first gate line GL1 to function as the scan pulse to drive the first gate line GL1. The first output pulse Vout1 outputted in the first period T1 is also supplied to the second and third node controllers NC2 and NC3 of the first stage ST1 via the first gate line GL1. In other words, the first output pulse Vout1 is supplied to the gate terminals of the sixth, eleventh, sixteenth and seventeenth switching devices Tr6, Tr11, Tr16 and Tr17 of the first stage ST1. As a result, all the sixth, eleventh, sixteenth and seventeenth switching devices Tr6, Tr11, Tr16 and Tr17 of the first stage ST1 are turned on. The discharging voltage VSS is supplied to the gate terminal of the seventh switching device Tr7 through the turned-on sixth switching device Tr6. The first AC voltage Vac1 of the high state is also supplied to the gate terminal of the seventh switching device Tr7 through the turned-on fourth switching device Tr4. Preferably, the sixth switching device Tr6 has a channel width wider than that of the fourth switching device Tr4. As a result, the discharging voltage VSS outputted by the sixth switching device Tr6 is supplied to the gate terminal of the seventh switching device Tr7, thereby causing the seventh switching device Tr7 to still remain turned off. The discharging voltage VSS is supplied to the gate terminal of the twelfth switching device Tr12 through the turned-on eleventh switching device Tr11, so that the twelfth switching device Tr12 still remains turned off. The discharging voltage VSS is supplied to the second node n2 through the turned-on sixteenth switching device Tr16. As a result, the first pull-down switching device Trpd1 connected to the second node n2 still remains turned off. The discharging voltage VSS is supplied to the third node n3 through the turned-on seventeenth switching device Tr17. As a result, the second pull-down switching device Trpd2 connected to the third node n3 still remains turned off. Meanwhile, the first output pulse Vout1 outputted from the pull-up switching device Trpu of the first stage ST1 in the first period T1 is supplied to the second stage ST2 to function as the start pulse to charge the first node n1 of the second stage ST2. Therefore, the second stage ST2 is enabled in the same manner that the first stage ST1 is enabled in the above-described initial period T0. In other words, the first output pulse Vout1 outputted from the first stage ST1 in the first period T1 is supplied to the gate terminal of the first switching device Tr1 of the second stage ST2. As a result, in the first period T1, the first node n1 of the second stage ST2 is charged, and the pull-up switching device Trpu of the second stage ST2 connected to the charged first node n1 is turned on. The first output pulse Vout1 outputted from the first stage ST1 is also supplied to the second and third node controllers NC2 and NC3 of the second stage ST2 via the first gate line GL1. In other words, the first output pulse Vout1 is supplied to the gate terminals of the fifth, tenth, eighth and thirteenth switching devices Tr5, Tr10, Tr8 and Tr13 of the second stage ST2 via the first gate line GL1. Consequently, in the first period T1, both the second and third nodes n2 and n3 of the second stage ST2 are discharged, so that both the first and second pull-down switching devices Trpd1 and Trpd2 are turned off.

Next, a description will be given of an operation in the second period T2. In the second period T2, only the second clock pulse CLK2 is maintained at the high state, whereas the remaining clock pulses CLK1, CLK3 and CLK4, including the start pulse Vst, and the first output pulse Vout1 are maintained at the low state. Accordingly, the first, fifth, tenth, eighth and thirteenth switching devices Tr1, Tr5, Tr10, Tr8 and Tr13 of the second stage ST2 are turned off in response to the first output pulse Vout1 of the low state. As the first switching device Tr1 is turned off, the first node n1 of the second stage ST2 floats. As a result, the first node n1 of the second stage ST2 is kept charged by the charging voltage VDD applied thereto in the first period T1, so that the pull-up switching device Trpu of the second stage ST2 with its gate terminal connected to the first node n1 remains turned on. At this time, the second clock pulse CLK2 is supplied to the drain terminal of the turned-on pull-up switching device Trpu, thereby causing the charging voltage VDD charged at the first node n1 of the second stage ST2 to be amplified. Consequently, the second clock pulse CLK2 supplied to the drain terminal of the pull-up switching device Trpu of the second stage ST2 is stably outputted through the source terminal of the pull-up switching device Trpu. This second clock pulse CLK2 outputted from the pull-up switching device Trpu is the second output pulse Vout2. The second output pulse Vout2 is then supplied to the second gate line GL2 to function as the scan pulse to drive the second gate line GL2. The second output pulse Vout2 is also supplied to the second and third node controllers NC2 and NC3 of the second stage ST2 via the second gate line GL2 so as to discharge the second and third nodes n2 and n3 of the second stage ST2 in the same manner as stated above. The second output pulse Vout2 is also supplied to the third stage ST3 so as to charge the first node n1 of the third stage ST3. The second output pulse Vout2 is also supplied to the second and third node controllers NC2 and NC3 of the third stage ST3 via the second gate line GL2 so as to discharge the second and third nodes n2 and n3 of the third stage ST3. The second output pulse Vout2 outputted from the second stage ST2 is also supplied to the first stage ST1 to discharge the first node n1 of the first stage ST1, and to charge the second node n2 thereof and discharge the third node n3 thereof. In other words, the first stage ST1 is disabled in response to the second output pulse Vout2 from the second stage ST2, which will hereinafter be described in detail.

The second output pulse Vout2 outputted from the second stage ST2 in the second period T2 is supplied to the gate terminal of the second switching device Tr2 of the first stage ST1. As a result, the second switching device Tr2 is turned on and the discharging voltage VSS is supplied to the first node n1 of the first stage S1 through the turned-on second switching device Tr2, thus turning off the pull-up switching device Trpu with its gate terminal connected to the discharged first node n1 of the first stage ST1. Accordingly, the output pulse of the low state is supplied to the first gate line GL1. Consequently, the first gate line GL1 is discharged and all switching devices of the first stage ST1 with their gate terminals connected to the discharged first gate line GL1 are turned off. In other words, the sixth, eleventh, sixteenth and seventeenth switching devices Tr6, Tr11, Tr16 and Tr17 of the first stage ST1 are turned off. Because the start pulse Vst is maintained at the low state in the second period T2, all switching devices of the first stage ST1, supplied with the start pulse Vst of the low state through the gate terminals thereof, are turned off. In other words, all the fifth, tenth, eighth and thirteenth switching devices Tr5, Tr10, Tr8 and Tr13 of the first stage ST1 are turned off.

As both the fifth and sixth switching devices Tr5 and Tr6, connected to the gate terminal of the seventh switching device Tr7 of the first stage ST1, are turned off, only the first AC voltage Vac1 of the high state outputted through the turned-on fourth switching device Tr4 is supplied to the gate terminal of the seventh switching device Tr7. Hence, the seventh switching device Tr7 is turned on and the first AC voltage Vac1 is supplied to the second node n2 of the first stage ST1 through the turned-on seventh switching device Tr7. As a result, the second node n2 is charged and the first pull-down switching device Trpd1 of the first stage ST1 with its gate terminal connected to the charged second node n2 is turned on. The discharging voltage VSS is supplied to the first gate line GL1 through the turned-on first pull-down switching device Trpd1. Consequently, the first gate line GL1 is discharged. Because the first AC voltage Vac1 of the high state is supplied to the gate terminal of the seventh switching device Tr7 from the second period until the end of the first frame period, the seventh switching device Tr7 is kept turned on for the same interval. The second node n2 of the first stage ST1, supplied with the first AC voltage Vac1 through the turned-on seventh switching device Tr7, is also kept charged for the same interval. As a result, the first pull-down switching device Trpd1 connected to the second node n2 is also kept turned on for the same interval. Accordingly, the first gate line GL1, supplied with the discharging voltage VSS through the turned-on first pull-down switching device Trpd1, is also kept discharged for the same interval. Therefore, it is possible to prevent the first gate line GL1 from floating for this interval. In this way, the third and fourth stages ST3 and ST4 output the third and fourth output pulses Vout3 and Vout4 in third and fourth periods T3 and T4, respectively, and are operated in the same manner as stated above.

Thereafter, in a fifth period T5, only the first clock pulse CLK1 is again maintained at the high state. The first clock pulse CLK1 outputted in the fifth period T5 is supplied to the fifth stage ST5. Then, the fifth stage ST5 outputs the fifth output pulse Vout5 using the first clock pulse CLK1 and supplies it to the fifth gate line, fourth stage and sixth stage. The first clock pulse CLK1 outputted in the fifth period T5 is also supplied to the first stage ST1. In particular, the first clock pulse CLK1 is supplied to the drain terminal of the pull-up switching device Trpu of the first stage ST1 and the gate terminal of the third switching device Tr3 of the first stage ST1. The third switching device Tr3 is operated in the same manner as that in the first exemplary embodiment. Namely, the third switching device Tr3 of each of the stages ST1 to STn functions to stabilize the output of the corresponding stage. In the second frame period, the first AC voltage Vac1 is maintained at the low state and the second AC voltage Vac2 is maintained at the high state. Hence, when each of the stages ST1 to STn is disabled, the third node controller NC3 is operated, thereby causing the third node n3 to be charged and the second node n2 to be discharged. As a result, in the second frame period, the second pull-down switching device Trpd2 connected to the third node n3 is operated to discharge the corresponding gate line.

Figure 13:
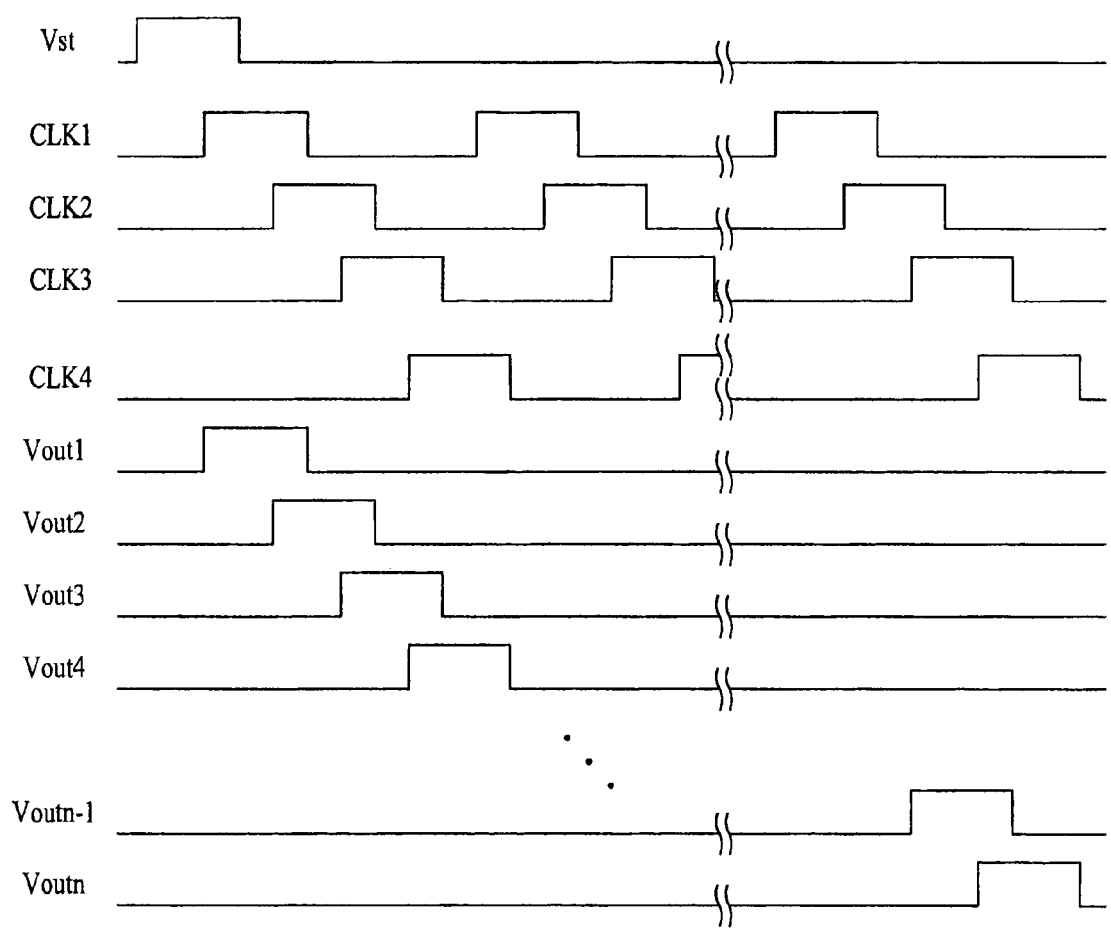
FIG. 13 is another timing diagram of the signals supplied to the shift registers of FIG. 2 and FIG. 7 and the output pulses outputted therefrom.

Meanwhile, the start pulse Vst and clock pulses CLK1 to CLK4 may have characteristics as follows. FIG. 13 is another timing diagram of the signals supplied to the shift registers of FIG. 2 and FIG. 7 and the output pulses outputted therefrom. The first to fourth clock pulses CLK1 to CLK4 are outputted out of phase with one another. In other words, the second clock pulse CLK2 is outputted after being phase-delayed by $\frac{1}{3}$ pulse width from the first clock pulse CLK1, and the third clock pulse CLK3 is outputted after being phase-delayed by $\frac{1}{3}$ pulse width from the second clock pulse CLK2. The fourth clock pulse CLK4 is outputted after being phase-delayed by $\frac{1}{3}$ pulse width from the third clock pulse CLK3, and the first clock pulse CLK1 is outputted after being phase-delayed by $\frac{1}{3}$ pulse width from the fourth clock pulse CLK4. The start pulse Vst is outputted in synchronization with the fourth clock pulse CLK4. It should be noted here that the start pulse Vst is outputted only once for a period of one frame, whereas each of the clock pulses CLK1 to CLK4 is outputted several times for the period of one frame. The clock pulses CLK1 to CLK4 have the same pulse widths and duty ratios. The adjacent ones of the clock pulses CLK1 to CLK4 assume the high state simultaneously for a certain period. For example, the first clock pulse CLK1 and the second clock pulse CLK2 have the same pulse widths (pulse widths of the high state), and the second half of the first clock pulse CLK1 overlaps with the first half of the second clock pulse CLK2. At this time, the overlap period of the first clock pulse CLK1 and second clock pulse CLK2 corresponds to about ⅓ pulse width. On the other hand, the second half of the start pulse Vst overlaps with the first half of the first clock pulse CLK1. When the clock pulses have overlapping high durations, the output pulses outputted from the stages ST1 to STn+1 also have overlapping high durations. In the case where these clock pulses are used, the kth stage is enabled by the output pulse from the (k−1)th stage and disabled by the output pulse from the (k+2)th stage.

Figure 14:
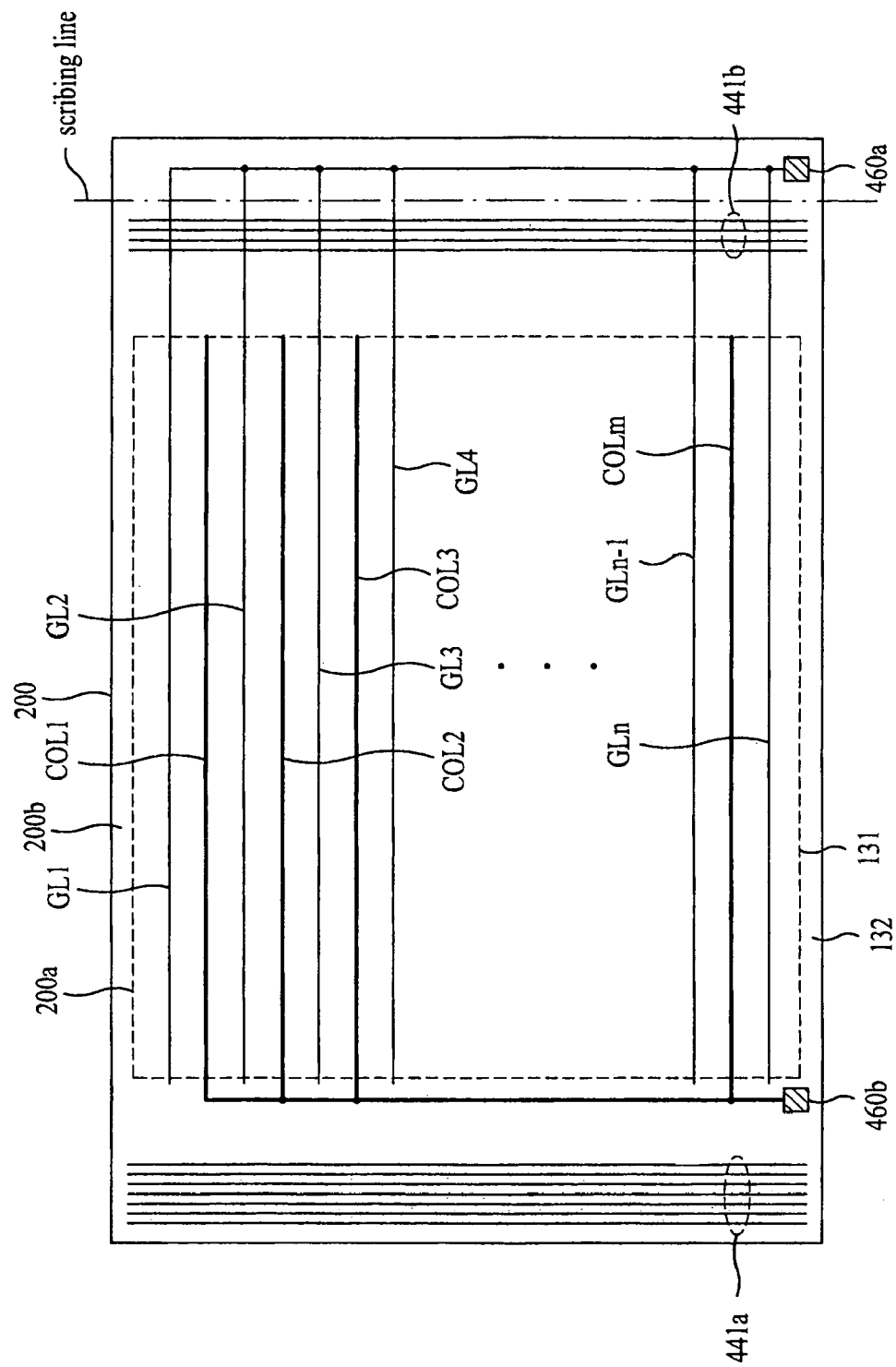
FIG. 14 is a view illustrating a short-circuit test between gate lines and common lines in a liquid crystal panel to which the shift registers according to the first and second exemplary embodiments of the present invention are applied.

FIG. 14 is a view illustrating a short-circuit test between gate lines and common lines in a liquid crystal panel to which the shift registers according to the first and second exemplary embodiments of the present invention are applied. In a liquid crystal panel 200, a plurality of gate lines GL1 to GLn and a plurality of common lines CL1 to CLm are arranged such that they extend in one direction in parallel. A display region 200a is located at a central portion of the liquid crystal panel 200, as a region for displaying an image. A non-display region 200b is located around the display region 200a. In the non-display region 200b, various lines for transferring signals required for pixels of the display region 200a and a shift register for driving the gate lines GL1 to GLn are formed. Each of the common lines CL1 to CLm is disposed between associated adjacent ones of the gate lines GL1 to GLn. Each of the common lines CL1 to CLm is adapted to form capacitors each providing an auxiliary capacitance for an associated pixel cell. Each of the common lines CL1 to CLm overlaps with the pixel electrodes of the associated pixel cells. The auxiliary capacitors are formed at portions of an associated one of the common lines CL1 to CLm overlapping with the associated pixel electrodes, respectively. Meanwhile, the common lines CL1 to CLm may be used as common electrodes in an in-plane switching mode LCD device. A plurality of first signal transfer lines 441a are formed in a portion of the non-display region 200b located at the left side of the display region 200a. The first signal transfer lines 441a transfer various signals required to drive a plurality of node controllers NC1 and a plurality of pull-up switching devices Trpu. A plurality of first signal transfer lines 441b are formed in a portion of the non-display region 200b located at the right side of the display region 200a. The second signal transfer lines 441b transfer various signals required to drive second and third node controllers NC2 and NC3, and to drive first and second pull-down switching devices Trpd1 and Trpd2.

Where the shift register according to the first exemplary embodiment of the present invention is incorporated in the liquid crystal panel 200, the first signal transfer lines 441a include a first start transfer line STL1 for transferring a start pulse Vst, a first charging voltage line DDL1 for transferring a charging voltage VDD, a first discharging voltage line SSL1 for transferring a discharging voltage VSS, and first to fourth clock transfer lines CL1 to CL4 for transferring first to fourth clock pulses CLK1 to CLK4. In this case, the second signal transfer lines 441b include a second start transfer line STL2 for transferring the start pulse Vst, a second charging voltage line DDL2 for transferring the charging voltage VDD, and a second discharging voltage line SSL2 for transferring the discharging voltage VSS. On the other hand, where the shift register according to the second exemplary embodiment of the present invention is incorporated in the liquid crystal panel 200, the first signal transfer lines 441a include signal lines identical to those of the above-described case. In this case, the second signal transfer lines 441b include a first AC voltage line acL1 for transferring a first AC voltage Vac1, and a second AC voltage line acL2 for transferring a second AC voltage Vac2, in addition to the second start transfer line STL2 and the second discharging voltage line SSL2.

The gate lines GL1 to GLn, the common lines CL1 to CLm, and the first signal transfer lines 441a are made of the same material. The gate lines GL1 to GLn, common lines CL1 to CLm, and first signal transfer lines 441a may be formed using a photolithography process. Since these lines are made of the same material, the formation thereof is achieved using a single mask process. The gate lines GL1 to GLn and common lines CL1 to CLm are formed such that they are adjacent to each other, and therefore may be a short-circuit between the two. For this reason, a short-circuit test must be performed after formation of the gate lines GL1 to GLn and common lines CL1 to CLm. The right ends of the gate lines GL1 to GLn are extended to a corresponding end of the liquid crystal panel 200 while crossing the second signal transfer lines 441b to be formed in the second non-display region 200b. The extended left ends of the gate lines GL1 to GLn are then electrically connected together. Also, the left ends of the common lines CL1 to CLm are connected together. A first test pad 460a is formed at one side of a region where the connected ends of the gate lines GL1 to GLn are disposed. A second test pad 460b is formed at one side of a region where the connected ends of the common lines CL1 to CLm are disposed. In order to perform a short-circuit test, a voltage is supplied to the gate lines GL1 to GLn and common lines CL1 to CLm via the first and second test pads 460a and 460b, respectively. If the gate lines GL1 to GLn and common lines CL1 to CLm are in a short-circuited state in this case, a current flow is generated. However, if the gate lines GL1 to GLn and common lines CL1 to CLm are in a state of being separated from each other, no current flow is generated. Thus, it is possible to check whether or not the gate lines GL1 to GLn and common lines CL1 to CLm are in a short-circuited state.

After the short-circuit test, the portion of the liquid crystal panel 200 where the connected portions of the gate lines GL1 to GLn are disposed are removed in accordance with a cutting process carried out along a scribing line on the liquid crystal panel 200, in order to electrically disconnect the gate lines GL1 to GLn. On the other hand, it is unnecessary to separate the common lines CL1 to CLm because the same voltage is supplied to the common lines CL1 to CLm. Meanwhile, the second signal transfer lines 441b should be made of a material different from that of the gate lines GL1 to GLn. This is because the ends of the gate lines GL1 to GLn, to be connected for the short-circuit test, should extend while crossing the second signal transfer lines 441b.

The first to fourth clock transfer lines CL1 to CL4 included in the first signal transfer lines 441a transfer signals to be used as outputs of the stages ST1 to STn+1, respectively. Accordingly, it is preferred that the first to fourth clock transfer lines CL1 to CL4 transferring the above-described signals be made of a material exhibiting low resistance and superior conductivity, similarly to the gate lines GL1 to GLn. However, for the lines for transferring a constant voltage, the second charging voltage line DDL2, the second discharging voltage line SSL2, the first AC voltage line acL1, and the second AC voltage line acL2 included in the second signal transfer lines 441b, a material exhibiting more or less high resistance may be used.

The gate lines GL1 to GLn, common lines CL1 to CLm, and first signal transfer lines 441a may be made of a metal material exhibiting superior conductivity. For example, they may be formed of aluminum (Al), an aluminum alloy (AlNd), a bi-alloy of aluminum alloy and molybdenum (Mo), or copper (Cu). The second signal transfer lines 441b are made of the same material as the data lines. In other words, the second signal transfer lines 441b are made of a material such as chromium (Cr) or molybdenum (Mo). An insulating film is formed between the second signal transfer lines 441b and signal lines made of the same material (the first signal transfer lines 441a, gate lines Gl1 to GLn, and common lines CL1 to CLm). It is possible to easily perform the short-circuit test for the gate lines GL1 to GLn and common lines CL1 to CLm, since the first signal transfer lines 441a are formed at one portion of the non-display region 200b whereas the second signal transfer lines 441b, which are made of a material different from the first signal transfer lines 441a, are formed at the other portion of the non-display region 200b.

Conventionally, a bi-directional shift register was used which drives the gate lines GL1 to GLn at both sides thereof, in order to increase the charging speed of the gate lines GL1 to GLn. The bi-directional shift register includes a first shift register connected to one side of the gate lines GL1 to GLn, and a second shift register connected to the other side of the gate lines GL1 to GLn. The shift registers have the same number of stages such that one gate line is driven by a pair of stages. The stages in each stage pair include switching devices having the same size, respectively. In other words, the switching devices of each stage pair having the same function have the same size. For this reason, the conventional bi-directional shift register must have switching devices of a number corresponding to two times the number of switching devices included in the shift register of the present invention. In other words, the switching devices included in the stages ST1 to STn+1 can have a channel width larger than that of the conventional switching devices by two times. Thus, the intensity of the output of the switching devices according to the present invention can be increased to a level as in the conventional bi-directional register.

It will be apparent to those skilled in the art that various modifications and variations can be made in the shift register of the present invention without departing from the spirit or scope of the invention. Thus, it is intended that the present invention cover the modifications and variations of this invention provided they come within the scope of the appended claims and their equivalents.

What is claimed is:

1. A shift register comprising a plurality of stages for sequentially outputting output pulses and supplying them to gates lines in a display region, each of the stages comprising:
    a first node controller disposed at one side of the non-display region, the first node controller controlling a signal state of a first node, wherein the first node controller comprises: a first switching device for supplying a charging voltage to the first node in response to an external start pulse or the output pulse from a previous stage; a second switching device for supplying the discharging voltage to the first node in response to the output pulse from the next stage; and a third switching device for electrically connecting the first node with an output terminal of the pull-up switching device in response to an external clock pulse;
    at least one pull-up switching device disposed at the one side of the display region, the pull-up switching device outputting an output pulse according to the signal state of the corresponding first node and supplying it to a corresponding gate line;
    a second node controller disposed at the other side of the display region, the second node controller controlling a signal state of a second node, wherein the second node controller comprises: a fourth switching device for supplying the charging voltage to the second node in response to the output pulse from the next stage; a fifth switching device for supplying the discharging voltage to the second node in response to the start pulse or the output pulse from the previous stage and a sixth switching device for supplying the discharging voltage to the second node in response to the output pulse from the corresponding stage; and
    a first pull-down switching device disposed at the other side of the display region, the first pull-down switching device outputting a discharging voltage according to the signal state of the second node and supplying it to the other side of the corresponding gate line.

2. The shift register according to claim 1, further comprising:
    a plurality of first signal transfer lines formed at the one side of the display region, the first signal transfer lines supplying various clock pulses and voltage signals necessary for the first and second node controllers;
    a plurality of second signal transfer lines formed at the other side of the display region, the second signal transfer lines supplying voltage signals necessary for the pull-up switching device and first pull-down switching device; and
    an insulating film formed between the first signal transfer lines and the second signal transfer lines.

3. The shift register according to claim 2, wherein the first signal transfer lines and the second signal transfer lines are made of different materials.

4. The shift register according to claim 3, wherein the first signal transfer lines are made of a material selected from the group consisting of aluminum, aluminum alloy, bi-alloy of aluminum alloy and molybdenum, and copper, and the second signal transfer lines are made of any one of chromium and molybdenum.

5. The shift register according to claim 3, wherein the first signal transfer lines are made of the same material as that of the gate lines, and the second signal transfer lines are made of the same material as that of data lines in the display region.

6. The shift register according to claim 2, wherein the first signal transfer lines include:
    a plurality of clock transfer lines for transferring clock pulses;
    a charging voltage line for transferring a charging voltage;
    a discharging voltage line for transferring the discharging voltage; and
    a start transfer line for transferring a start pulse.

7. The shift register according to claim 2, wherein the second signal transfer lines include:
    a start transfer line for transferring a start pulse; and
    a discharging voltage line for transferring the discharging voltage.

8. The shift register according to claim 7, wherein the second signal transfer lines further include:
    a first AC voltage line for transferring a first AC voltage; and
    a second AC voltage line for transferring a second AC voltage.

9. The shift register according to claim 1, further comprising two clock pulses with different phases, the clock pulses being inputted into the pull-up switching devices disposed at the one side of the display region.

* * * * *